US009842902B1

(12) United States Patent
Masuoka et al.

(10) Patent No.: US 9,842,902 B1
(45) Date of Patent: Dec. 12, 2017

(54) METHOD FOR PRODUCING SURROUNDING GATE SEMICONDUCTOR DEVICE

(71) Applicant: Unisantis Electronics Singapore Pte. Ltd., Peninsula Plaza (SG)

(72) Inventors: Fujio Masuoka, Tokyo (JP); Hiroki Nakamura, Tokyo (JP)

(73) Assignee: UNISANTIS ELECTRONICS SINGAPORE PTE. LTD., Singapore (SG)

( * ) Notice: Subject to any disclaimer, the term of this patent is extended or adjusted under 35 U.S.C. 154(b) by 0 days.

(21) Appl. No.: 15/672,549

(22) Filed: Aug. 9, 2017

Related U.S. Application Data

(60) Division of application No. 14/755,317, filed on Jun. 30, 2015, now Pat. No. 9,768,267, which is a
(Continued)

(51) Int. Cl.
*H01L 29/423* (2006.01)
*H01L 29/66* (2006.01)
(Continued)

(52) U.S. Cl.
CPC .. *H01L 29/42356* (2013.01); *H01L 21/02532* (2013.01); *H01L 21/28088* (2013.01);
(Continued)

(58) Field of Classification Search
CPC ............. G02F 1/136204; H01L 27/124; H01L 27/0248; H01L 33/0041; H01L 27/1225; H01L 2924/0002
See application file for complete search history.

(56) References Cited

U.S. PATENT DOCUMENTS 6,891,234 B1   5/2005 Connelly et al.
7,115,476 B1 * 10/2006 Izumida ............ H01L 21/28273
                                                        257/E21.209
(Continued)

FOREIGN PATENT DOCUMENTS

JP      H02-071556 A    3/1990
JP      H02-188966 A    7/1990
(Continued)

OTHER PUBLICATIONS

Mistry et al., "A 45nm Logic Technology with High-k+Metal Gate Transistors, Strained Silicon, 9 Cu Interconnect Layers, 193nm Dry Patterning, and 100% Pb-free Packaging", *IEEE*, pp. 247-250, 2007.
(Continued)

*Primary Examiner* — John P Dulka
(74) *Attorney, Agent, or Firm* — Brinks Gilson & Lione

(57) ABSTRACT

An SGT is produced by forming a first insulating film around a fin-shaped semiconductor layer, forming a pillar-shaped semiconductor layer in an upper portion of the fin-shaped layer, forming a second insulating film, a polysilicon gate electrode covering the second insulating film, and a polysilicon gate line, forming a diffusion layer in an upper portion of the fin-shaped layer and a lower portion of the pillar-shaped layer, forming a metal-semiconductor compound in an upper portion of the diffusion layer in the fin-shaped layer, depositing an interlayer insulating film, exposing and etching the polysilicon gate electrode and gate line, depositing a first metal, forming a metal gate electrode and a metal gate line, and forming a third metal sidewall on an upper side wall of the pillar-shaped layer. The third metal sidewall is connected to an upper surface of the pillar-shaped layer.

8 Claims, 40 Drawing Sheets

Related U.S. Application Data continuation of application No. PCT/JP2013/062423, filed on Apr. 26, 2013.

(51) Int. Cl.
| | |
|---|---|
| *H01L 21/308* | (2006.01) |
| *H01L 21/3105* | (2006.01) |
| *H01L 21/311* | (2006.01) |
| *H01L 21/321* | (2006.01) |
| *H01L 21/3213* | (2006.01) |
| *H01L 29/78* | (2006.01) |
| *H01L 21/02* | (2006.01) |
| *H01L 27/088* | (2006.01) |
| *H01L 21/8234* | (2006.01) |
| *H01L 21/28* | (2006.01) |
| *H01L 29/08* | (2006.01) |
| *H01L 29/10* | (2006.01) |
| *H01L 29/40* | (2006.01) |
| *H01L 21/285* | (2006.01) |

(52) U.S. Cl.
CPC .. *H01L 21/28114* (2013.01); *H01L 21/28525* (2013.01); *H01L 21/308* (2013.01); *H01L 21/31051* (2013.01); *H01L 21/31105* (2013.01); *H01L 21/31144* (2013.01); *H01L 21/3213* (2013.01); *H01L 21/32115* (2013.01); *H01L 21/823487* (2013.01); *H01L 27/088* (2013.01); *H01L 29/0847* (2013.01); *H01L 29/1037* (2013.01); *H01L 29/401* (2013.01); *H01L 29/42364* (2013.01); *H01L 29/66545* (2013.01); *H01L 29/66666* (2013.01); *H01L 29/7827* (2013.01)

(56) References Cited

U.S. PATENT DOCUMENTS

| | | | | |
|---|---|---|---|---|
| 7,304,343 B2 * | 12/2007 | Masuoka | ............ | H01L 27/115 257/314 |
| 2003/0107133 A1 | 6/2003 | Tomita | | |
| 2008/0061370 A1 * | 3/2008 | Matsuo | ............ | H01L 29/41791 257/347 |
| 2008/0209118 A1 * | 8/2008 | Kajiyama | ............ | G11C 11/155 711/105 |
| 2009/0042347 A1 * | 2/2009 | Oyu | ................... | H01L 29/0653 438/268 |
| 2009/0078993 A1 * | 3/2009 | Fujimoto | .......... | H01L 29/66666 257/328 |
| 2010/0210079 A1 | 8/2010 | Masuoka et al. | | |
| 2010/0264484 A1 | 10/2010 | Masuoka et al. | | |
| 2012/0049252 A1 * | 3/2012 | Masuoka | .......... | H01L 29/42356 257/288 |
| 2016/0336400 A1 * | 11/2016 | Masuoka | ........ | H01L 21/823431 |
| 2016/0343854 A1 * | 11/2016 | Masuoka | ............ | H01L 29/4238 |
| 2016/0343871 A1 * | 11/2016 | Masuoka | ................ | H01L 29/78 |
| 2016/0343879 A1 * | 11/2016 | Masuoka | ................ | H01L 29/78 |
| 2016/0343880 A1 * | 11/2016 | Masuoka | .......... | H01L 29/66477 |

FOREIGN PATENT DOCUMENTS

| | | |
|---|---|---|
| JP | H03-145761 A | 6/1991 |
| JP | 11-297984 A | 10/1999 |
| JP | 2003-179132 A | 6/2003 |
| JP | 2004-356314 A | 12/2004 |
| JP | 2010-251678 A | 11/2010 |
| WO | WO 2009/110050 A1 | 9/2009 |

OTHER PUBLICATIONS

International Search Report and Written Opinion with English translation for PCT/JP2013/062423 dated Jul. 23, 2013, 6 pages.
English translation of International Preliminary Report on Patentability for corresponding International Application No. PCT/JP2013/062423 dated Nov. 5, 2015, 7 pages.
Office Action in corresponding U.S. Appl. No. 14/755,317, dated Dec. 29, 2016, 9 pages.
Notice of Allowance in corresponding U.S. Appl. No. 14/755,317, dated Jun. 28, 2017, 8 pages.

* cited by examiner

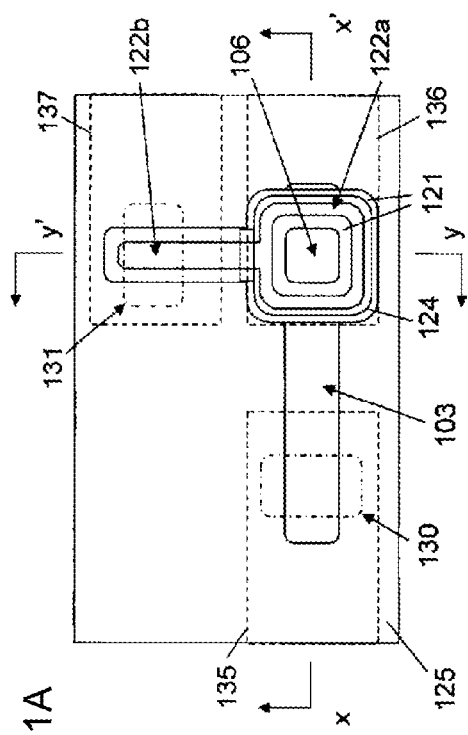
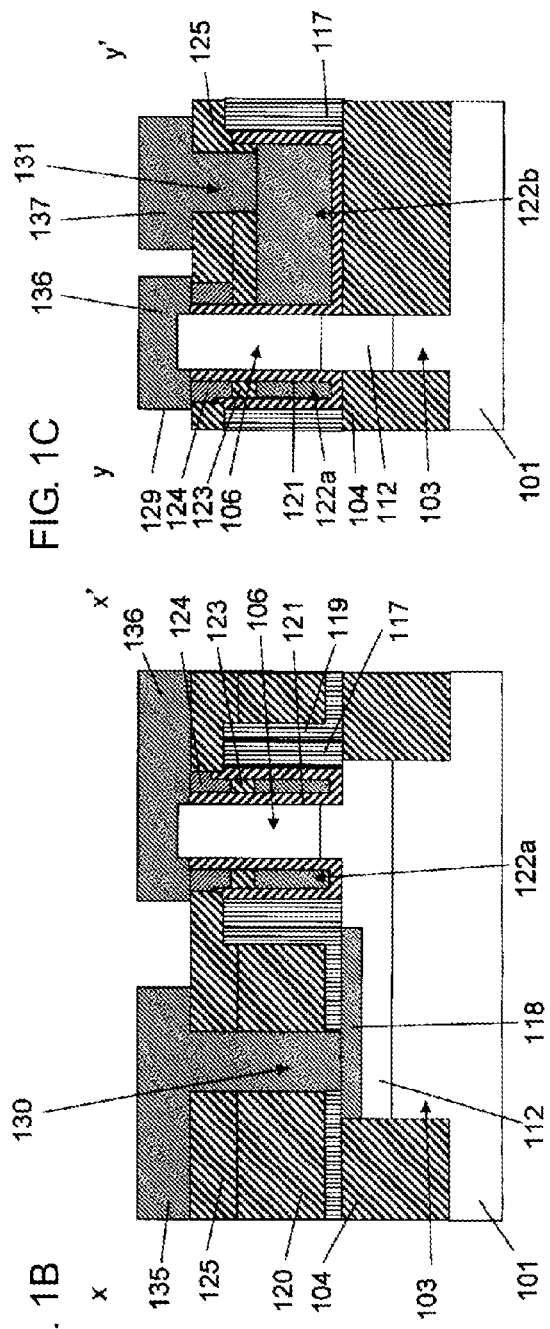
FIG. 1A
FIG. 1B
FIG. 1C

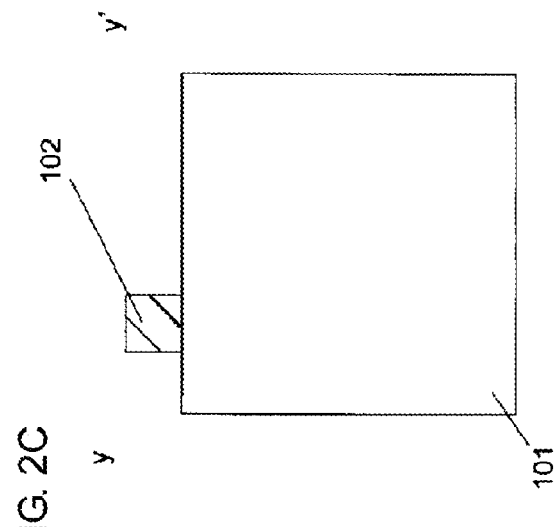
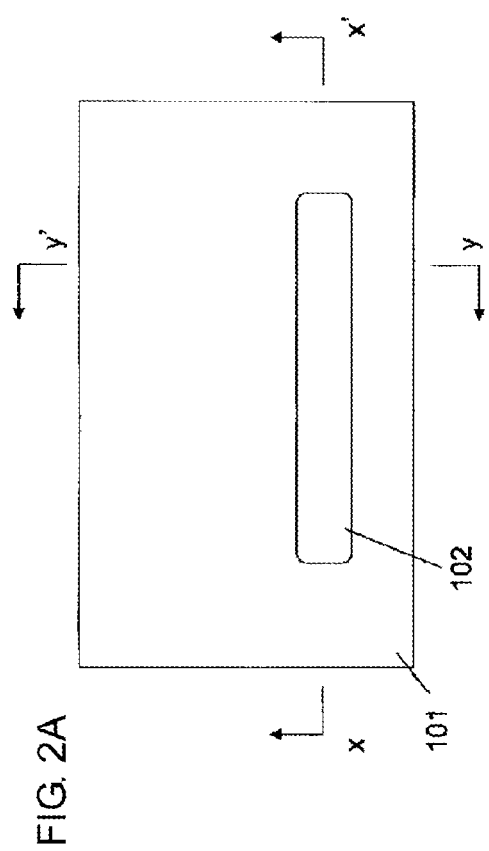
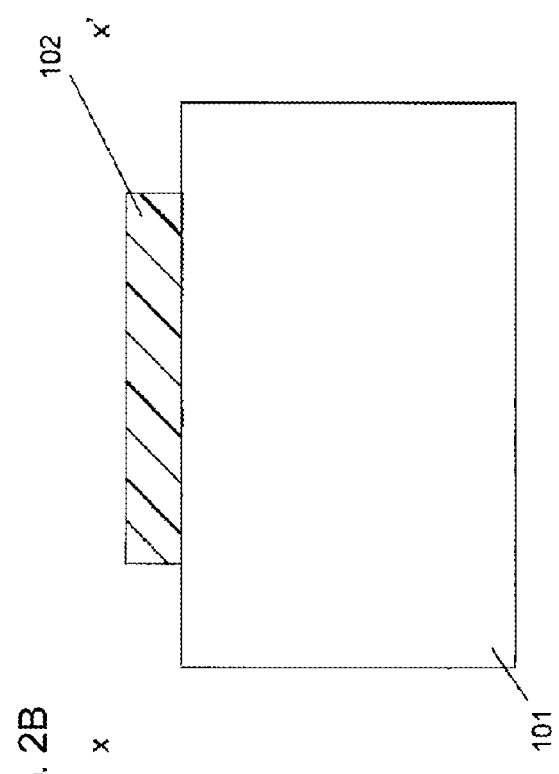

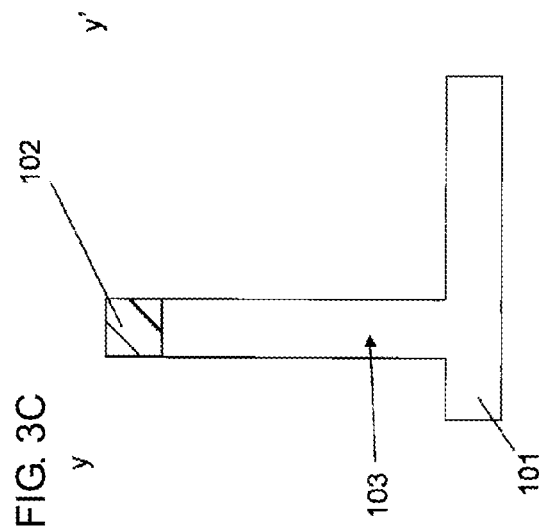
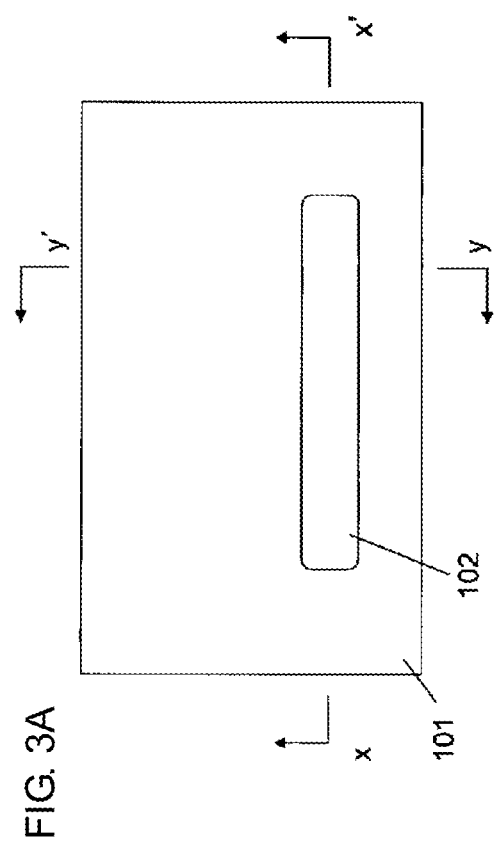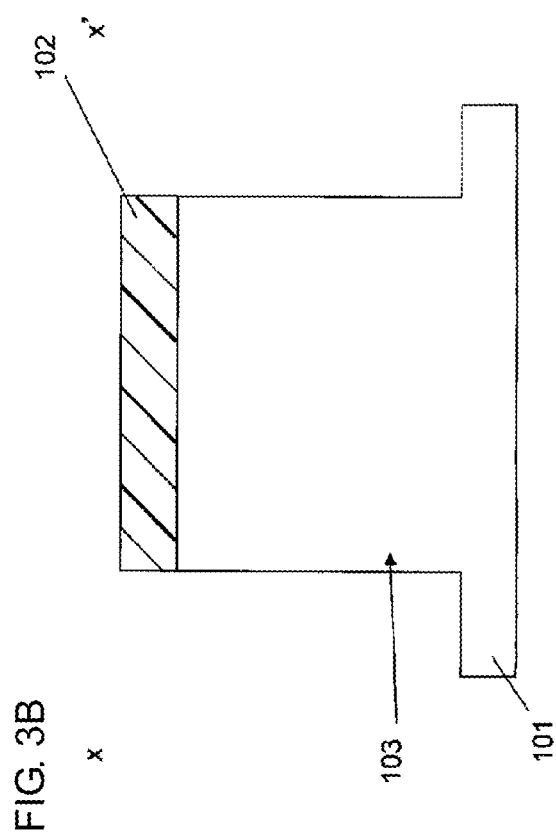

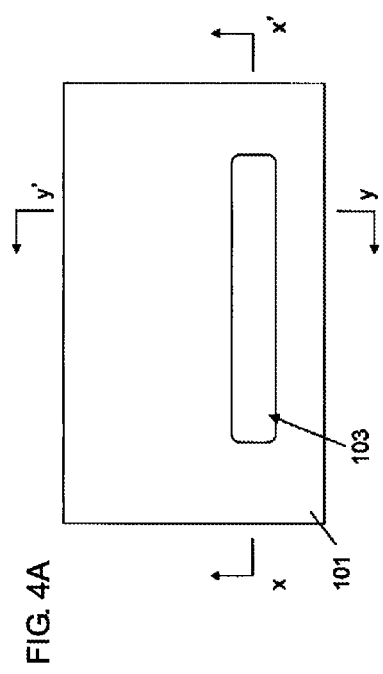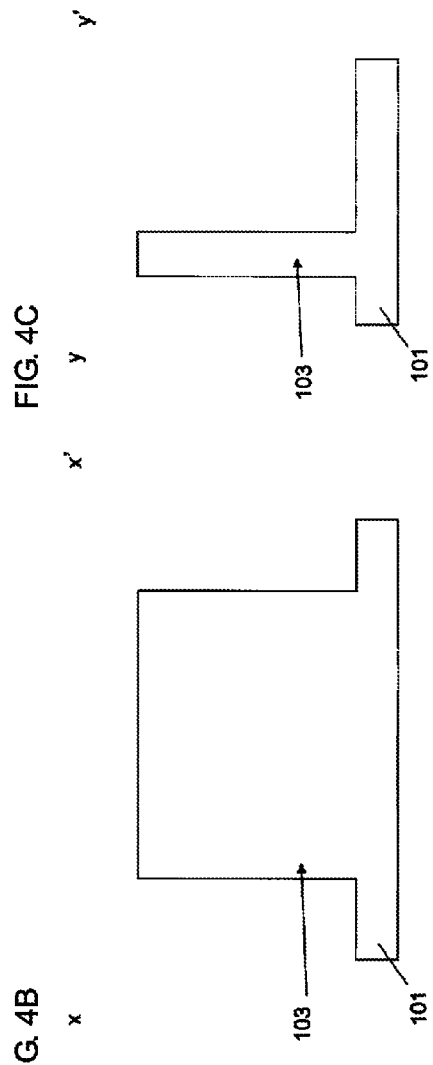

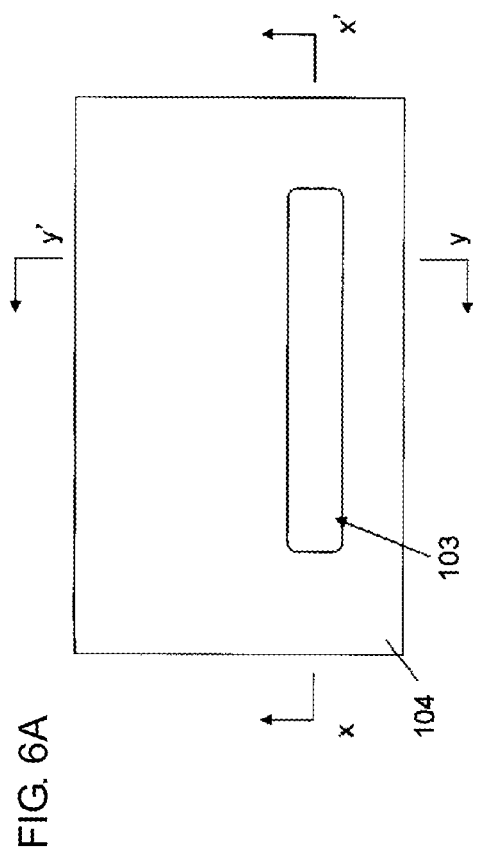
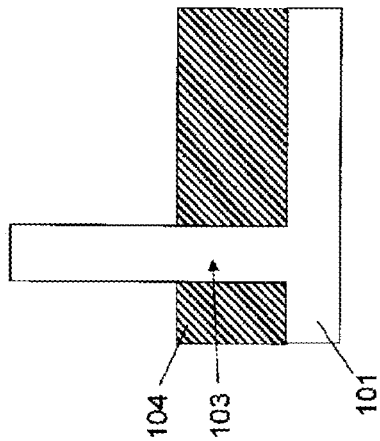
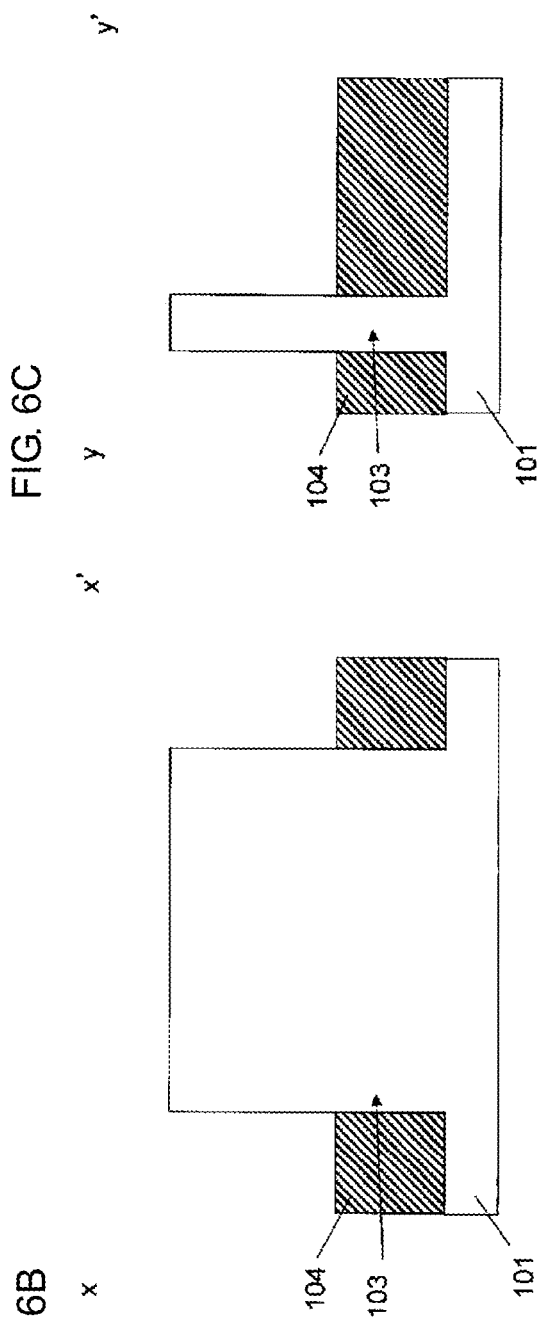
FIG. 6A
FIG. 6B
FIG. 6C

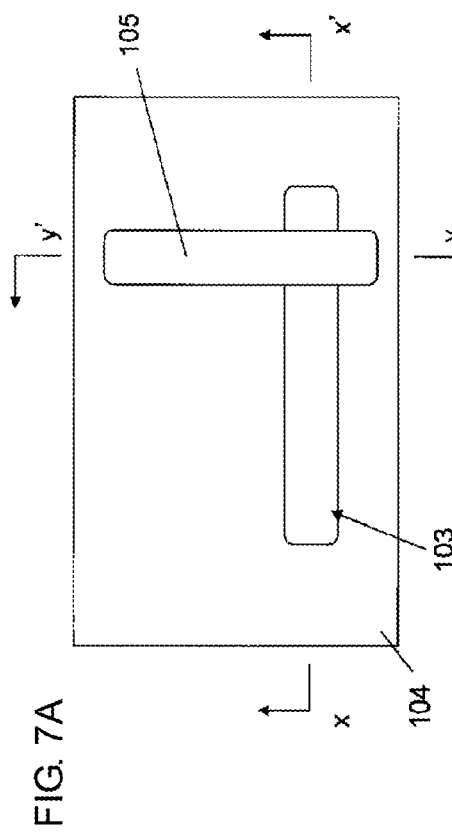
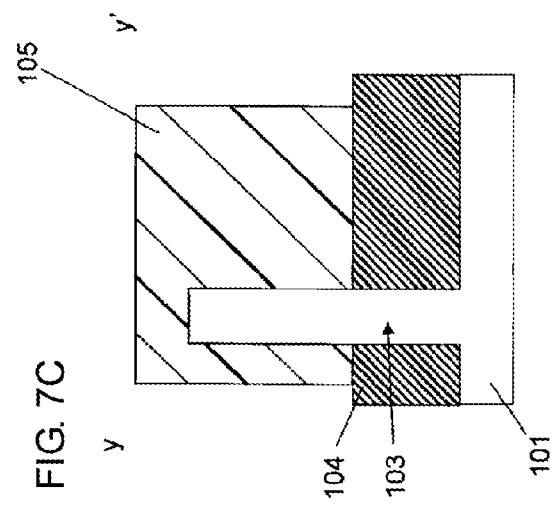
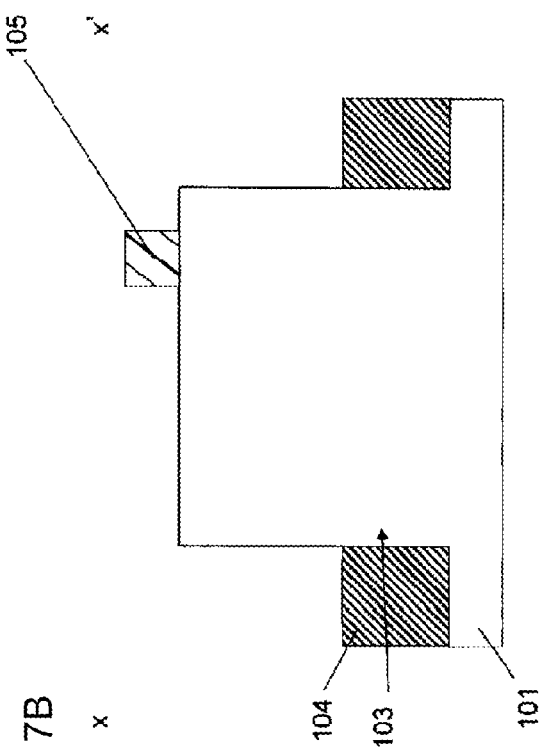

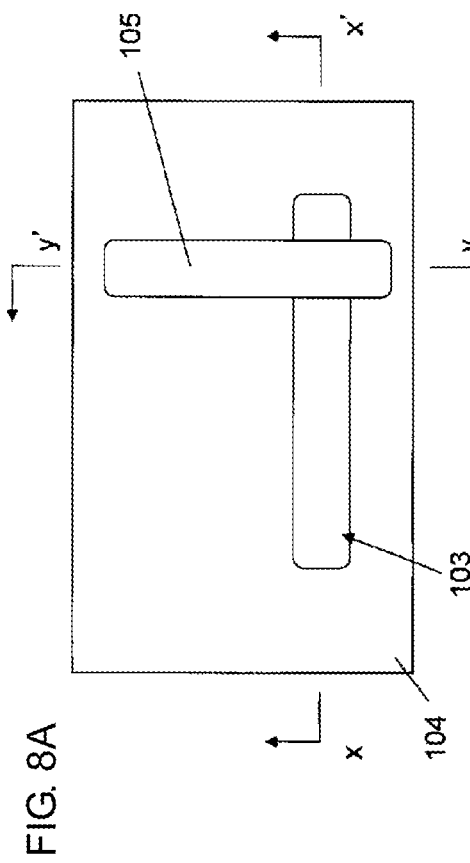
FIG. 8A
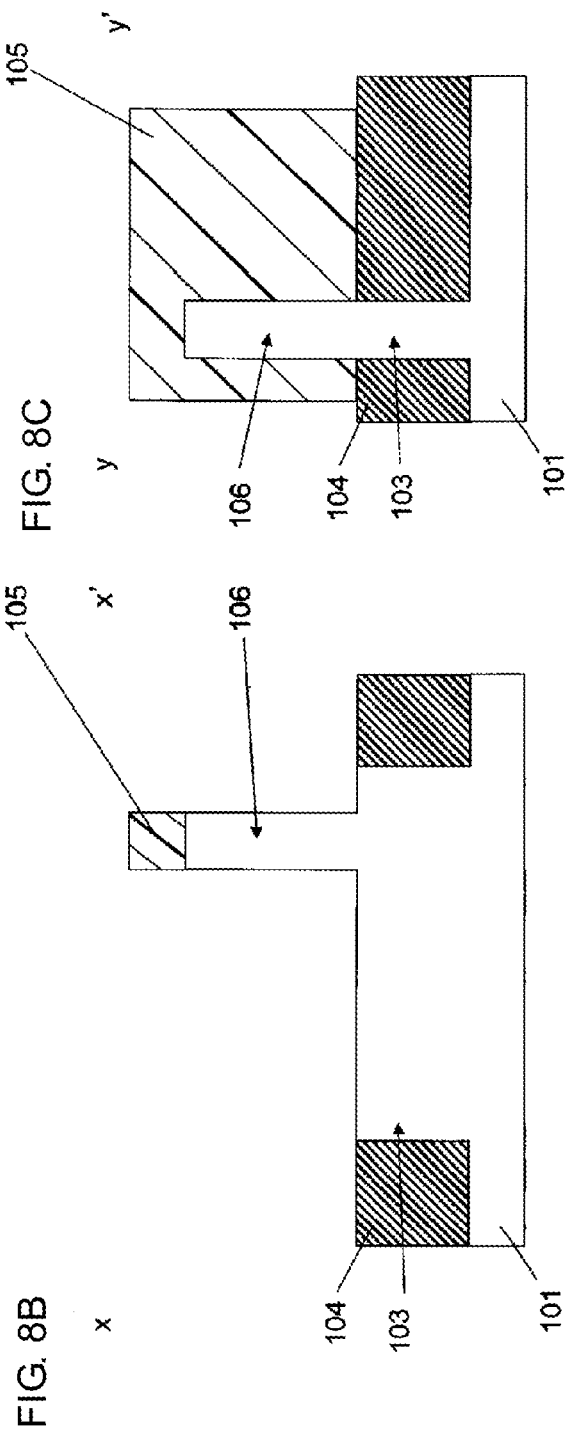
FIG. 8B
FIG. 8C

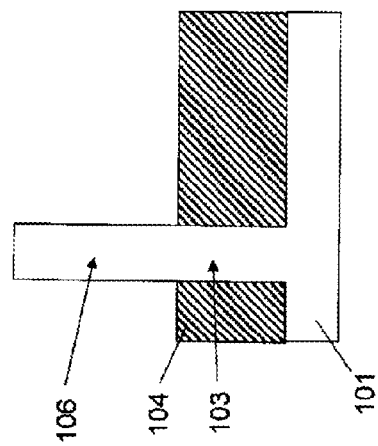
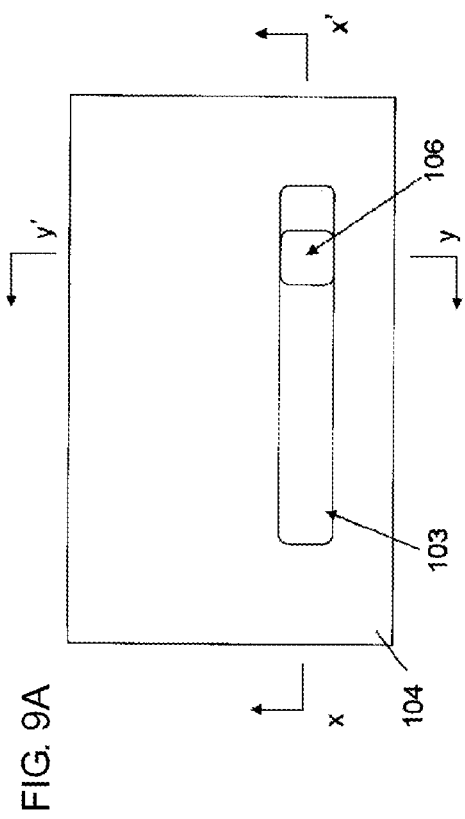
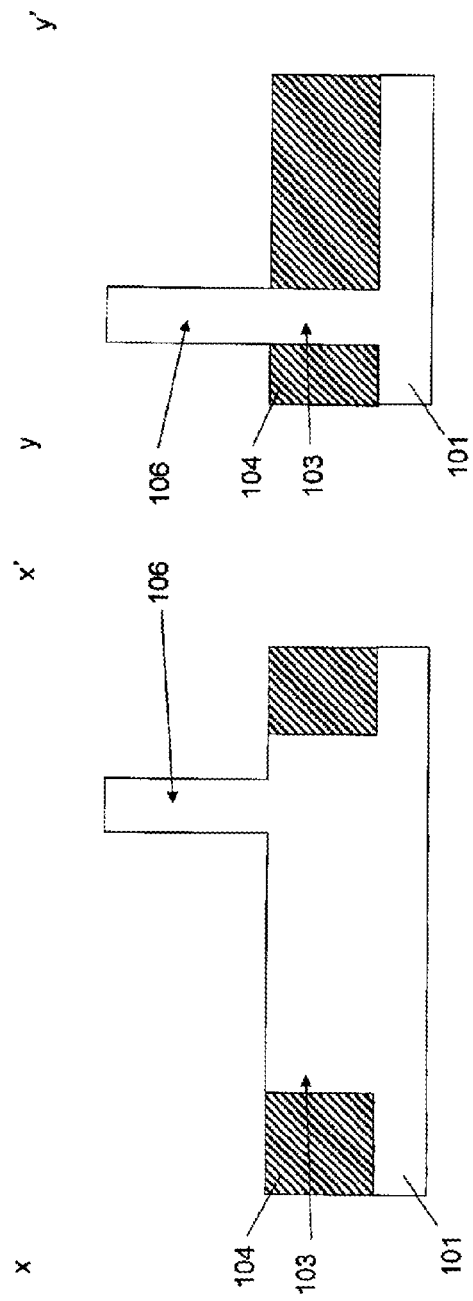

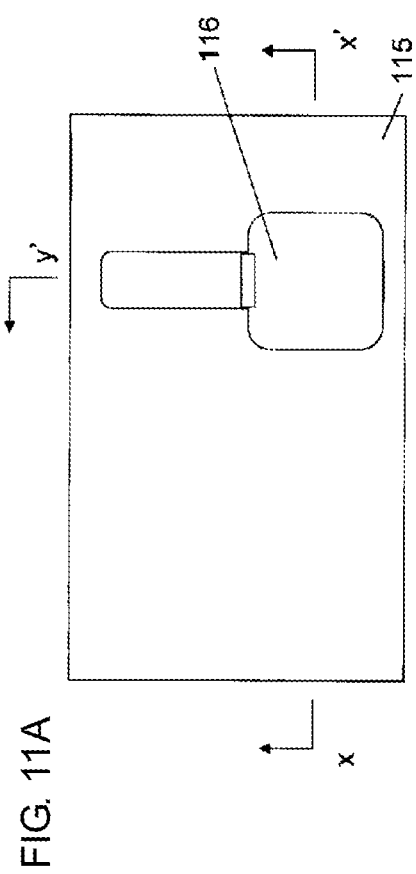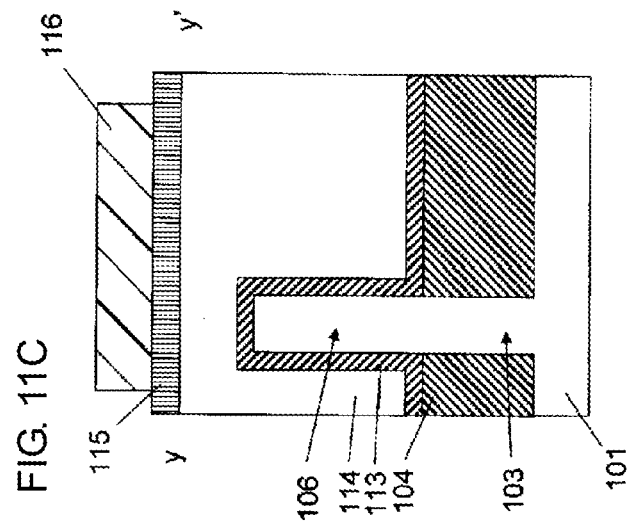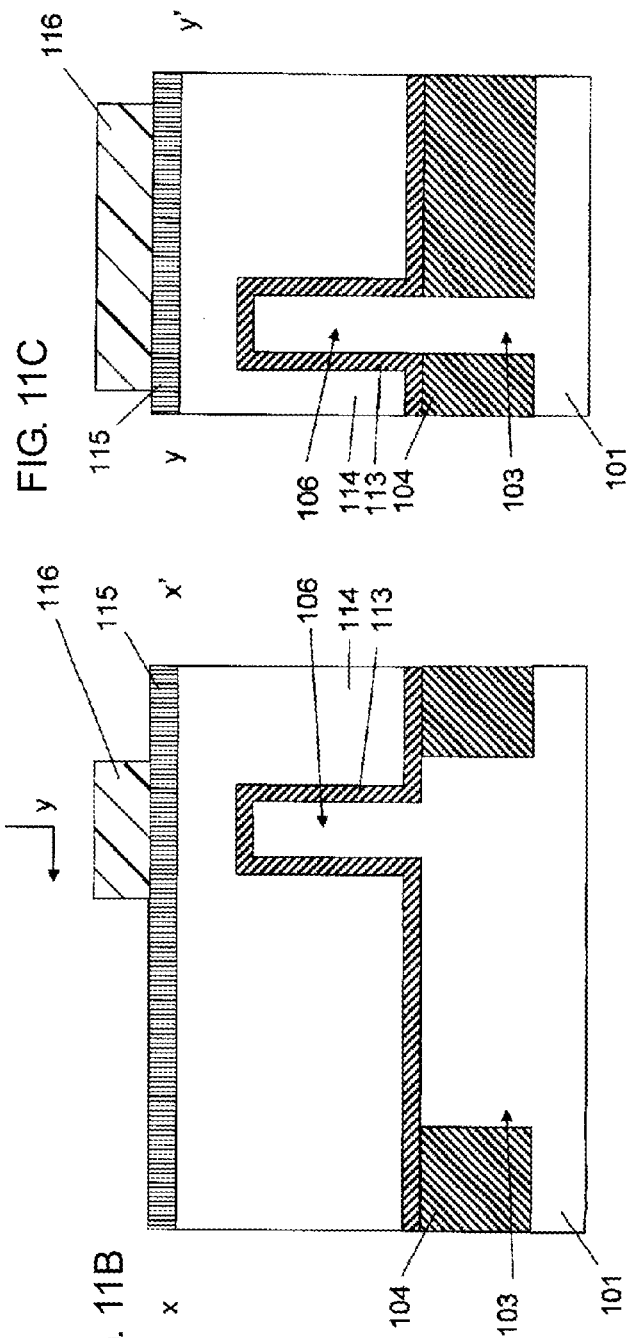

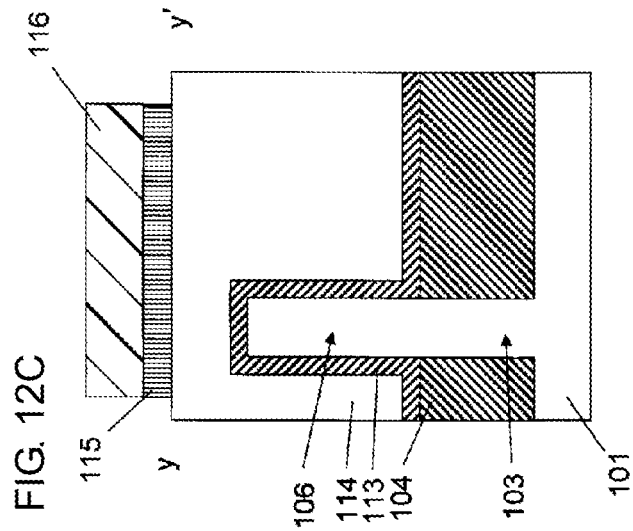
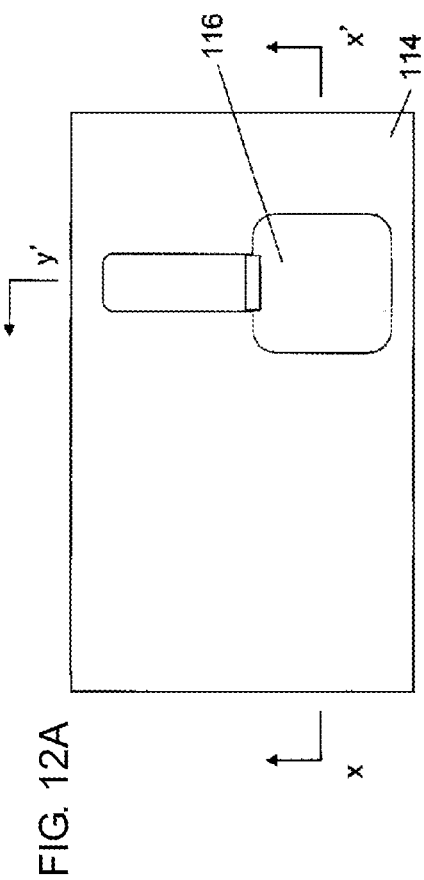
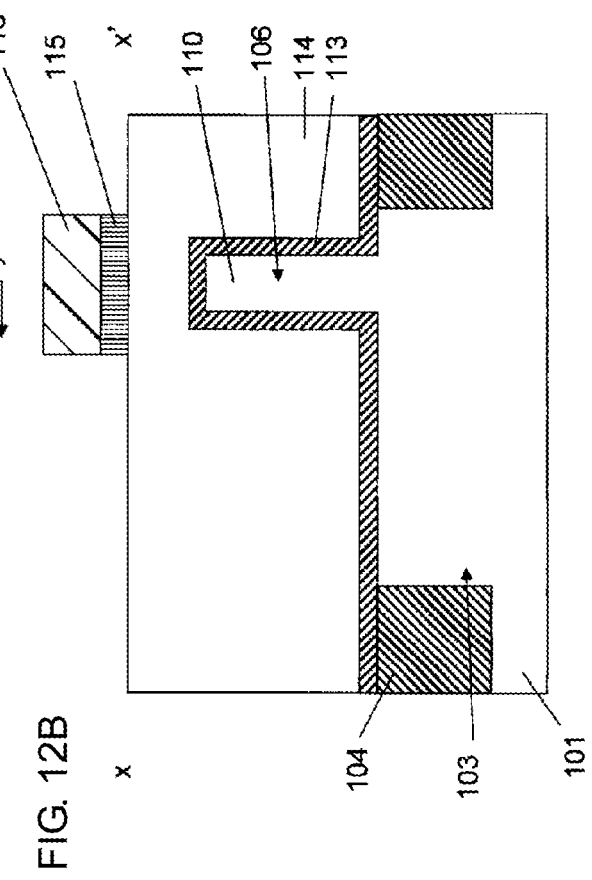

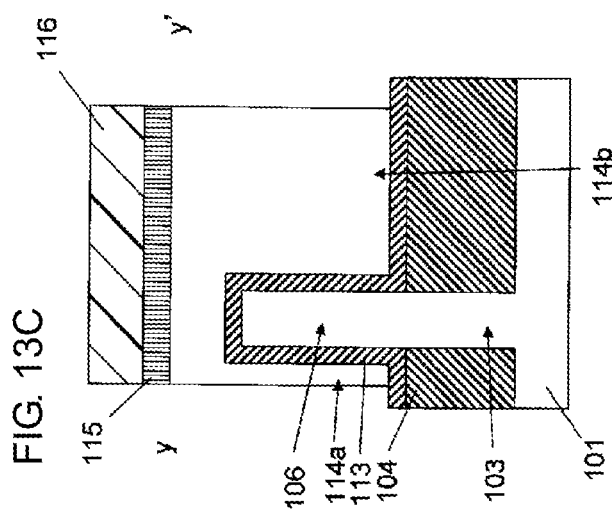
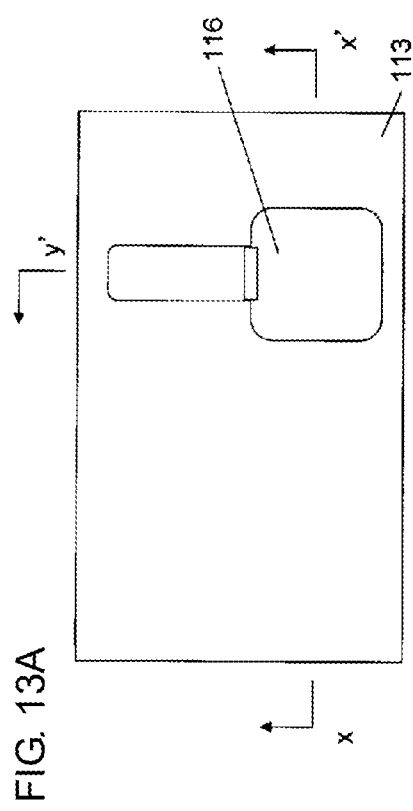
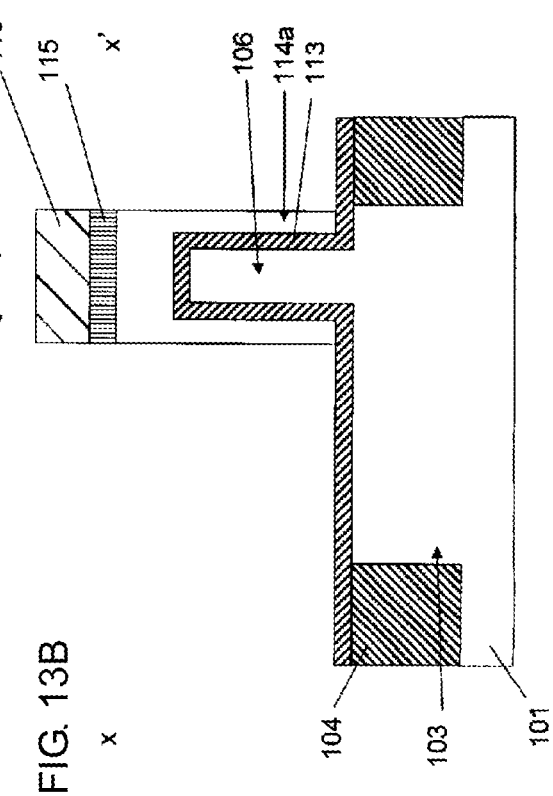
FIG. 13A
FIG. 13B
FIG. 13C

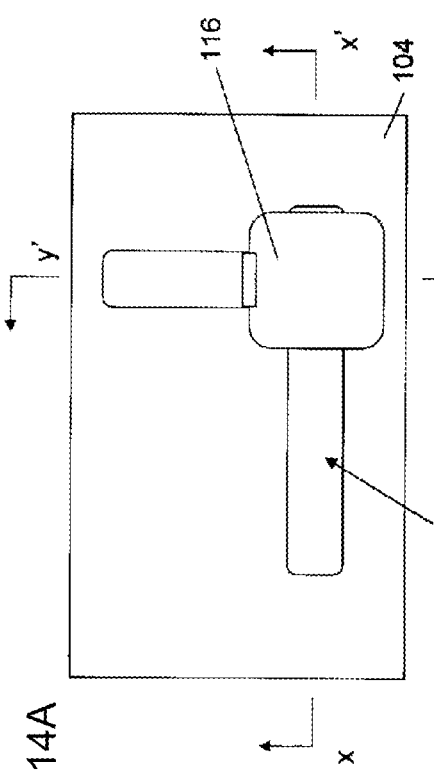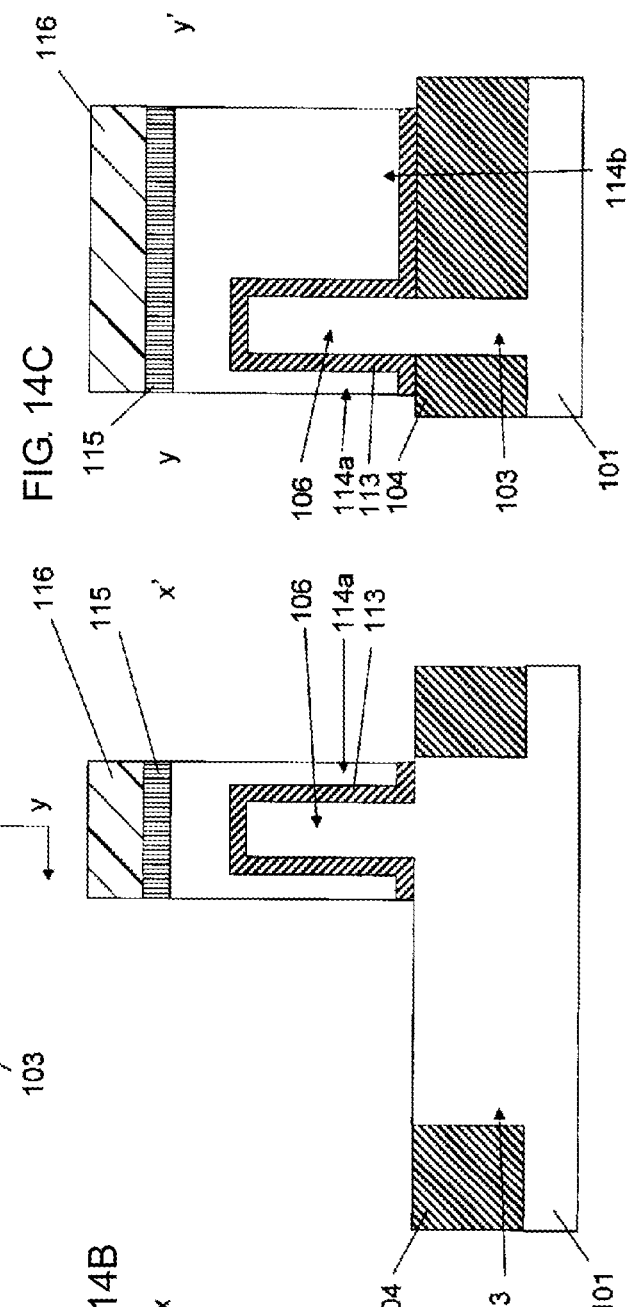
FIG. 14A
FIG. 14B
FIG. 14C

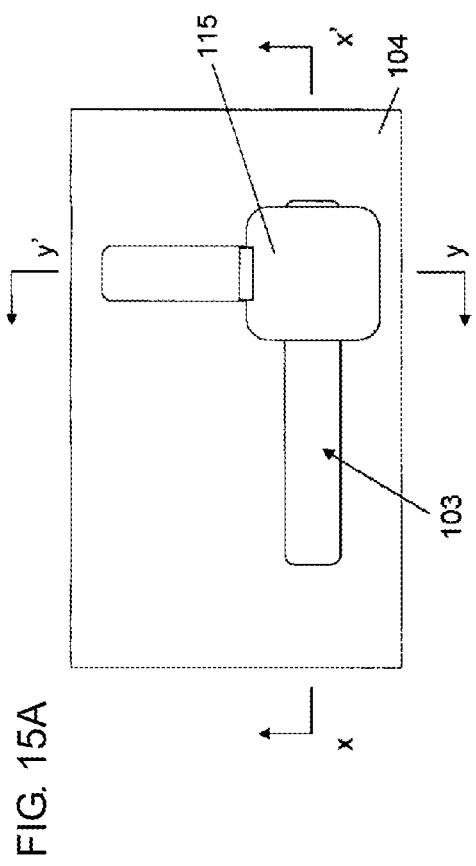
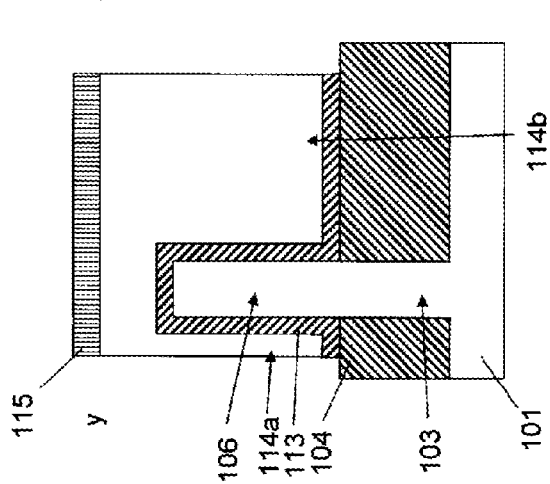
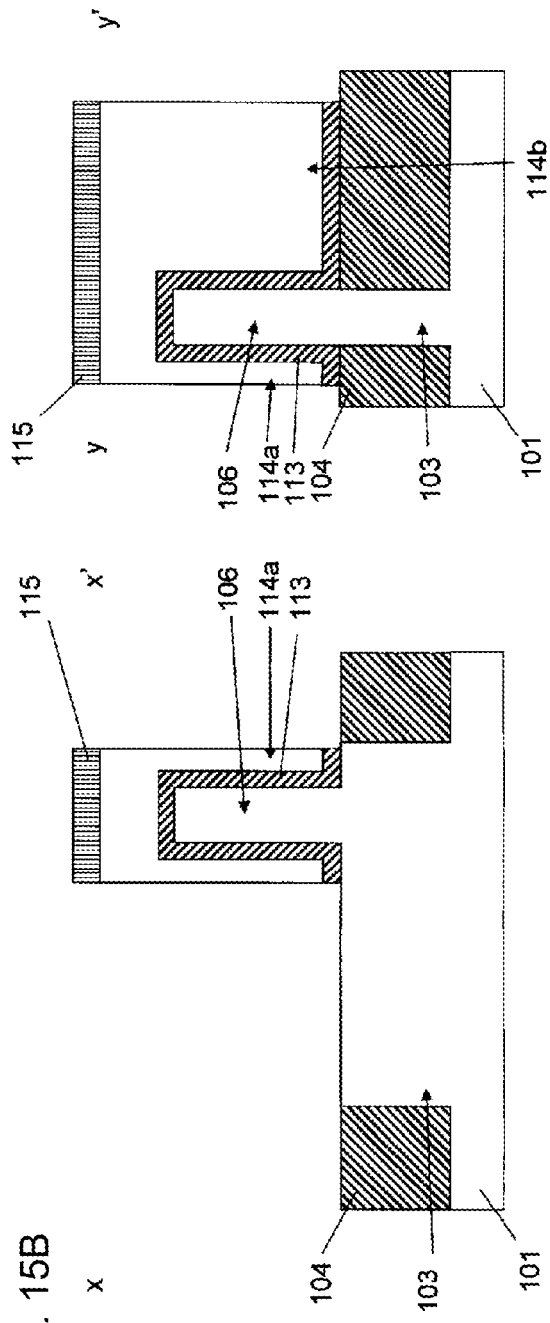

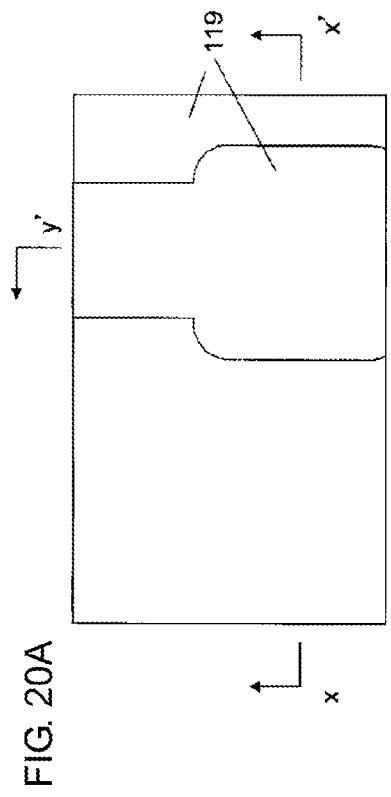
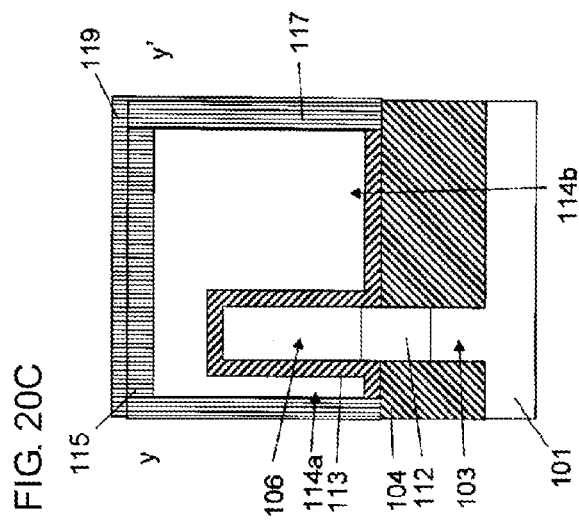
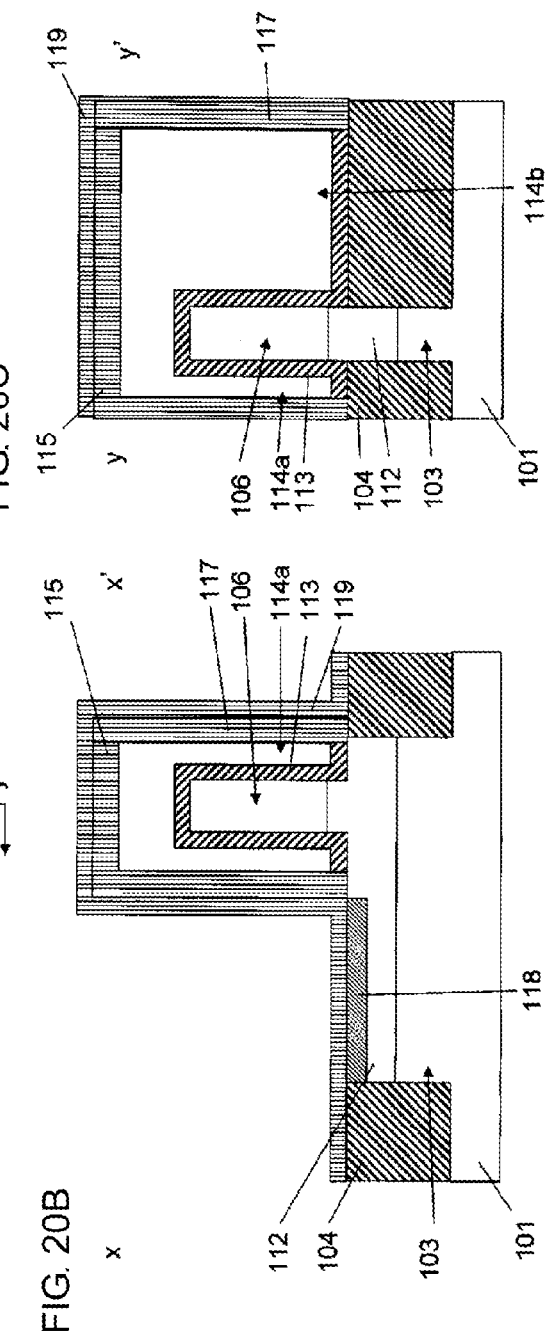
FIG. 20A
FIG. 20B
FIG. 20C

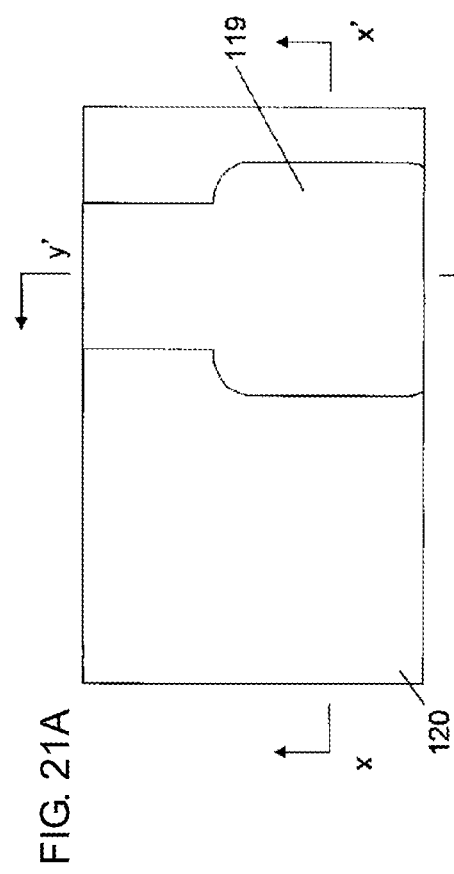
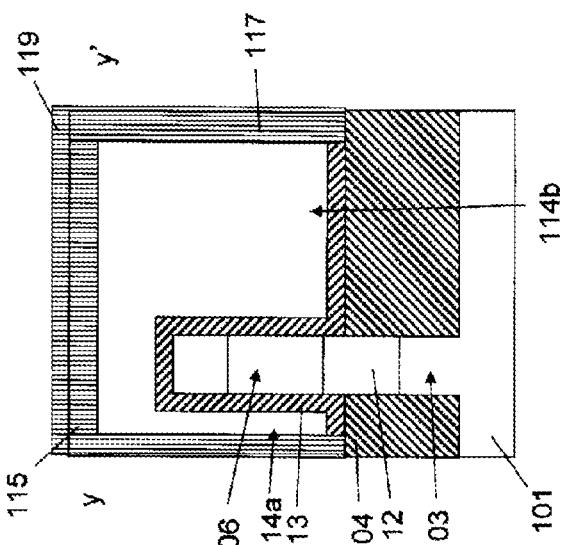
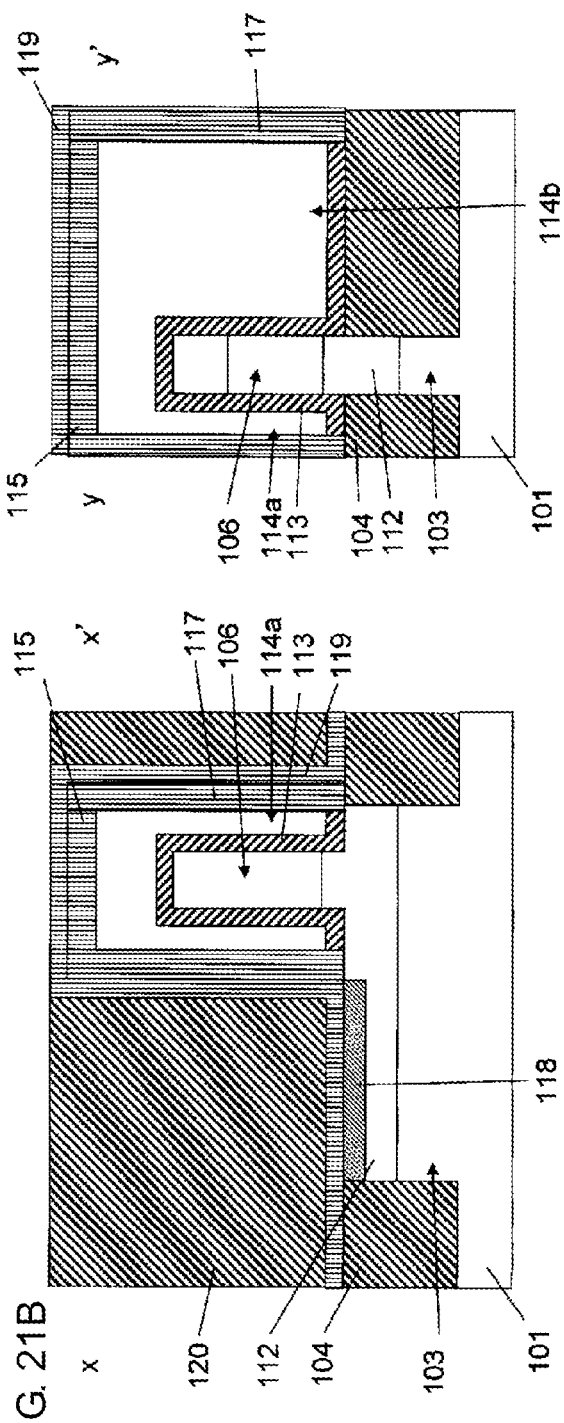

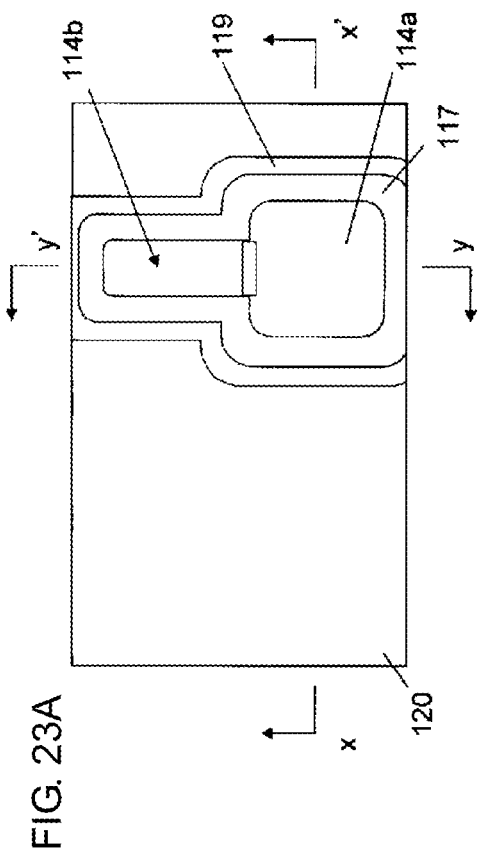
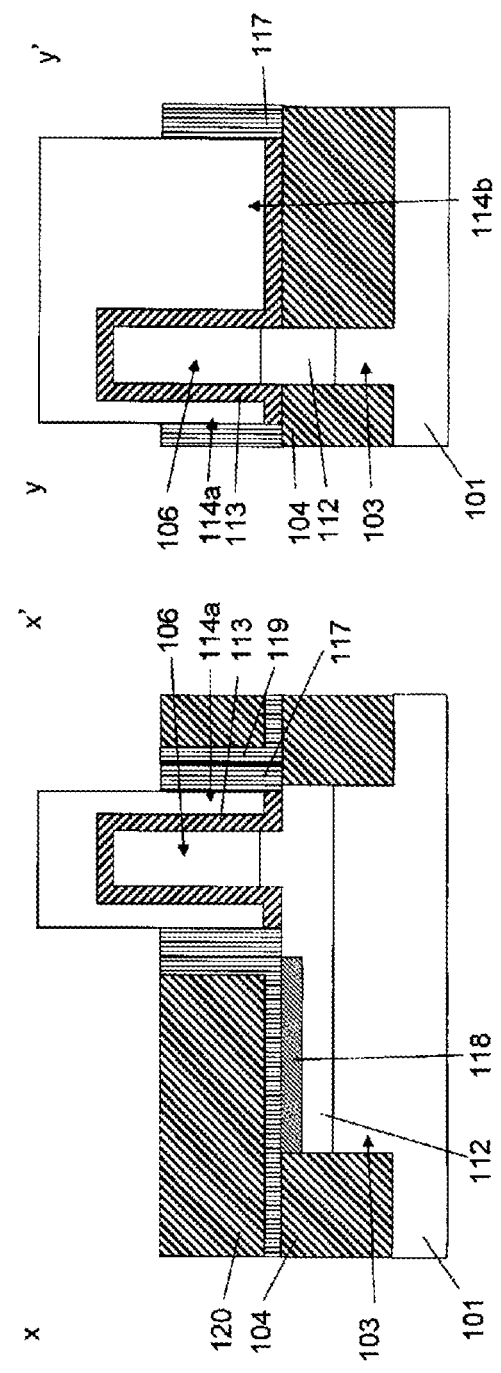
FIG. 23A
FIG. 23B
FIG. 23C

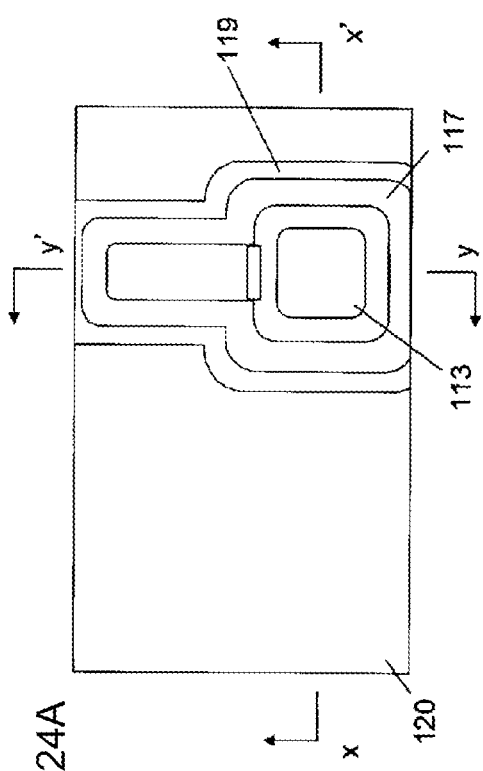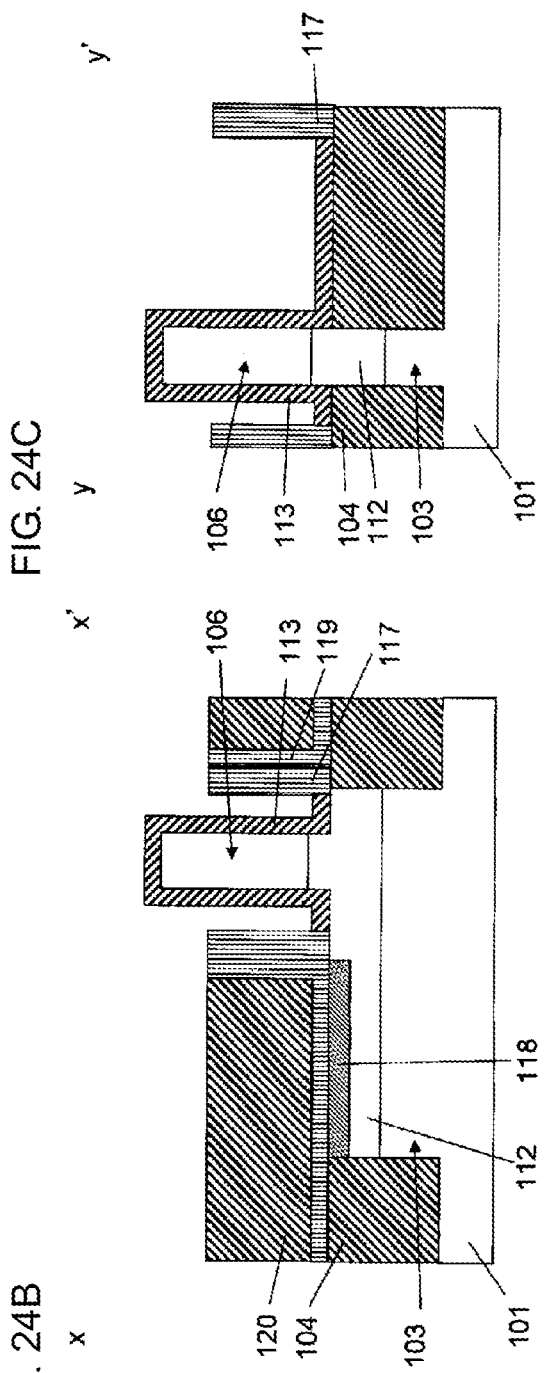

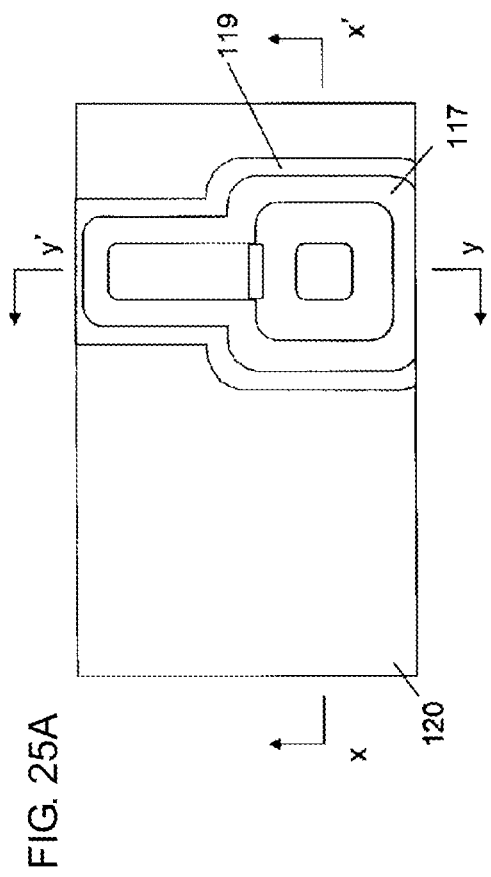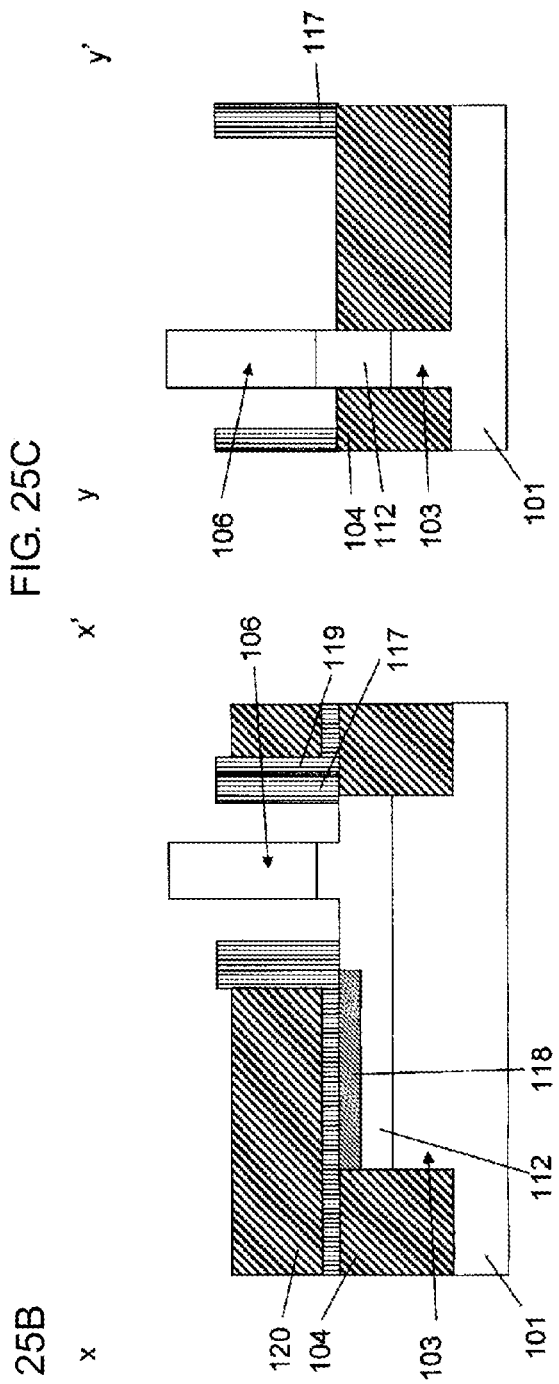
FIG. 25A
FIG. 25B
FIG. 25C

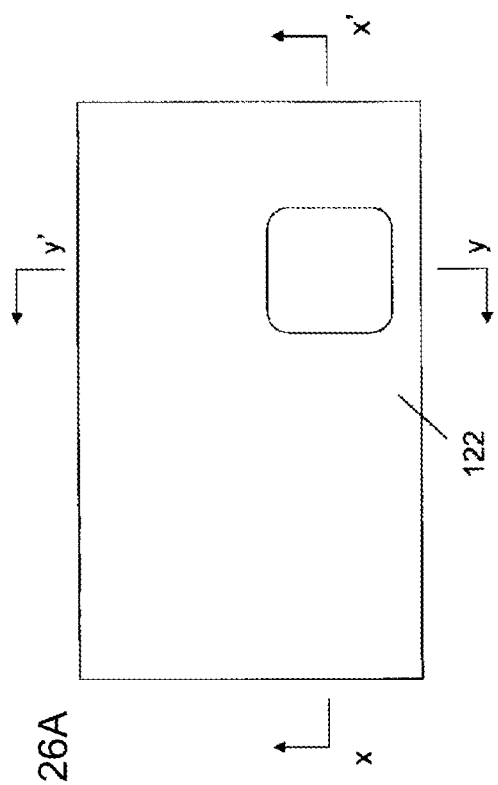
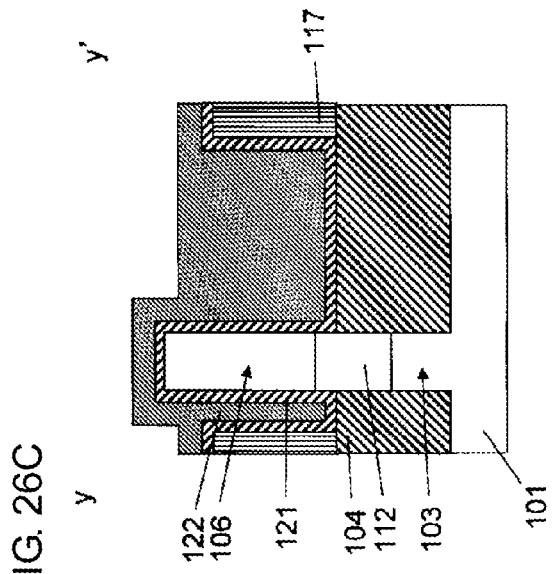
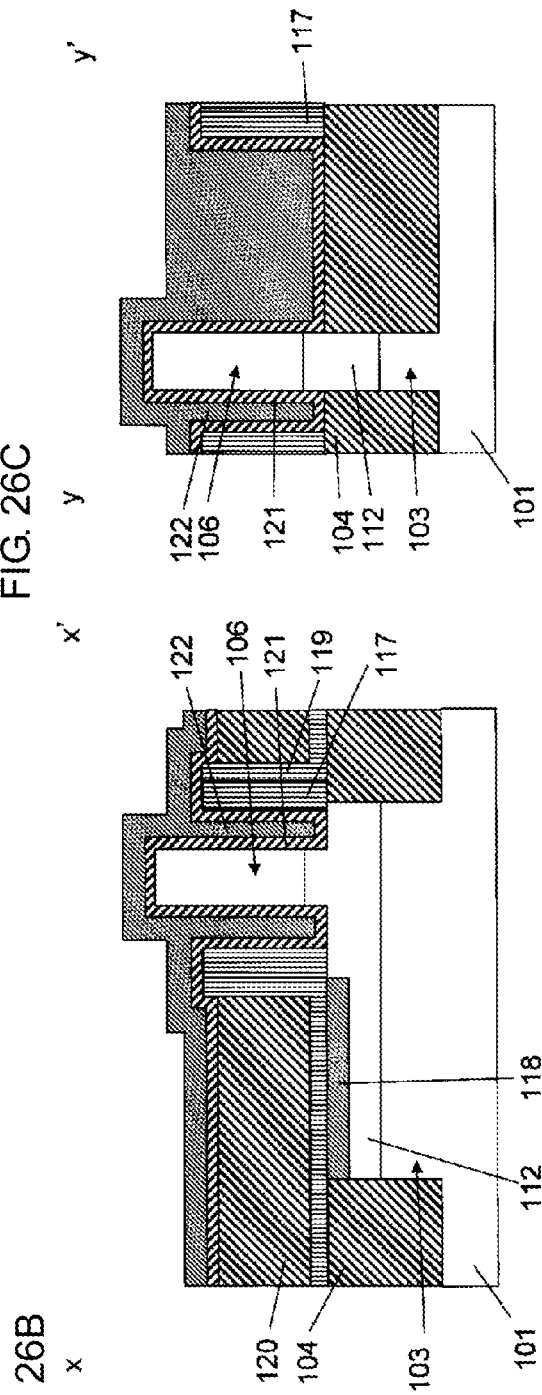
FIG. 26A
FIG. 26B
FIG. 26C

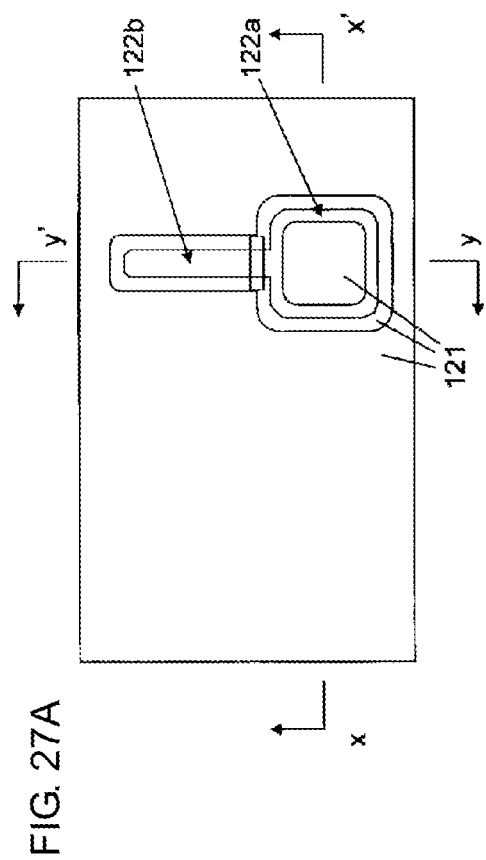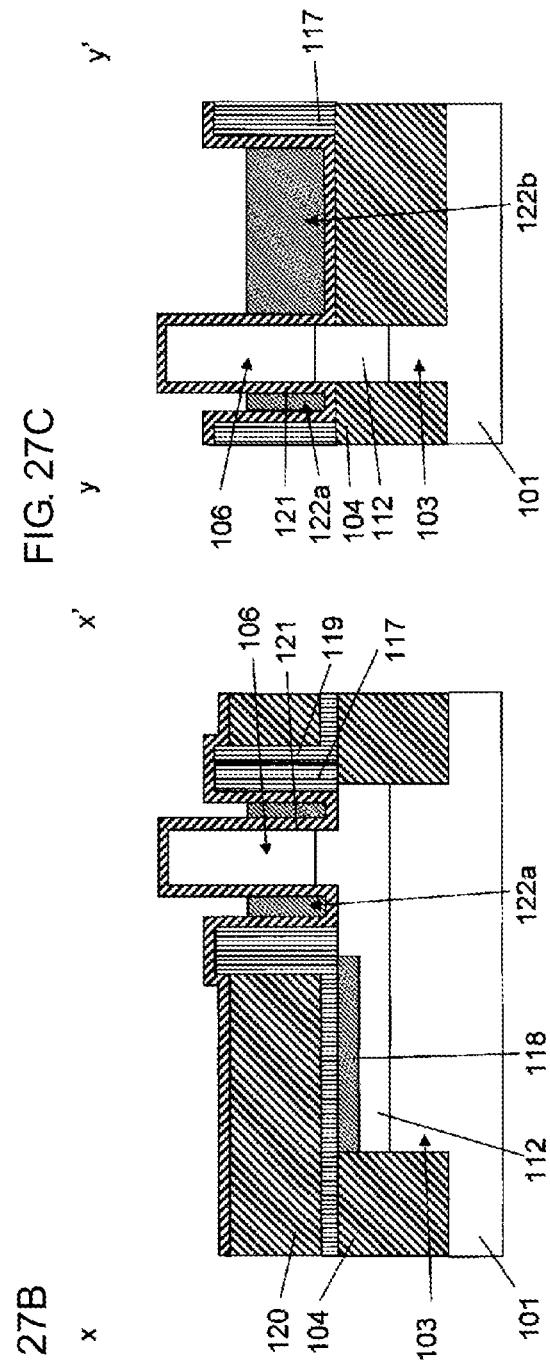

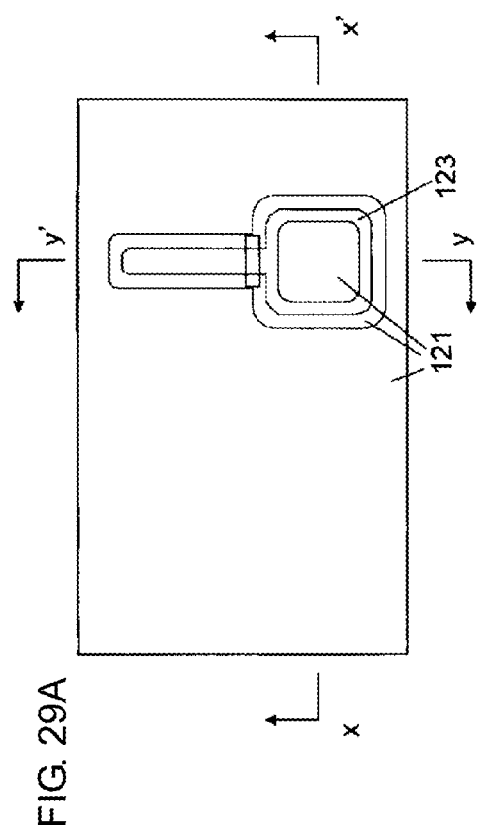
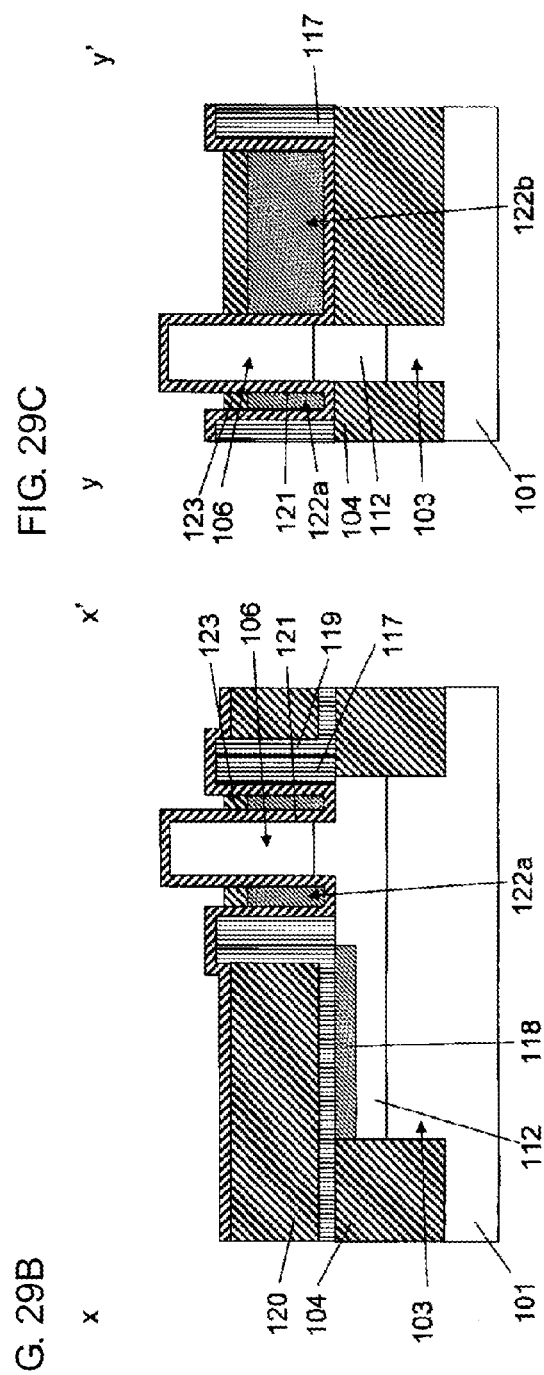
FIG. 29A
FIG. 29B
FIG. 29C

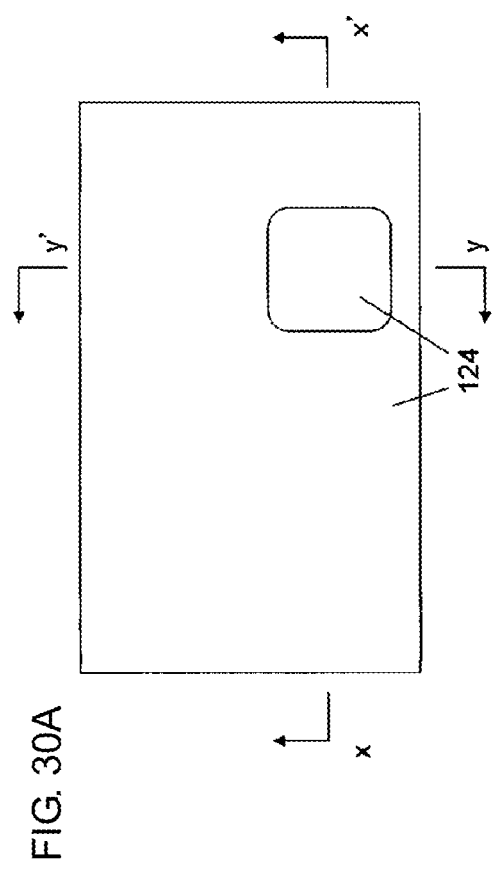
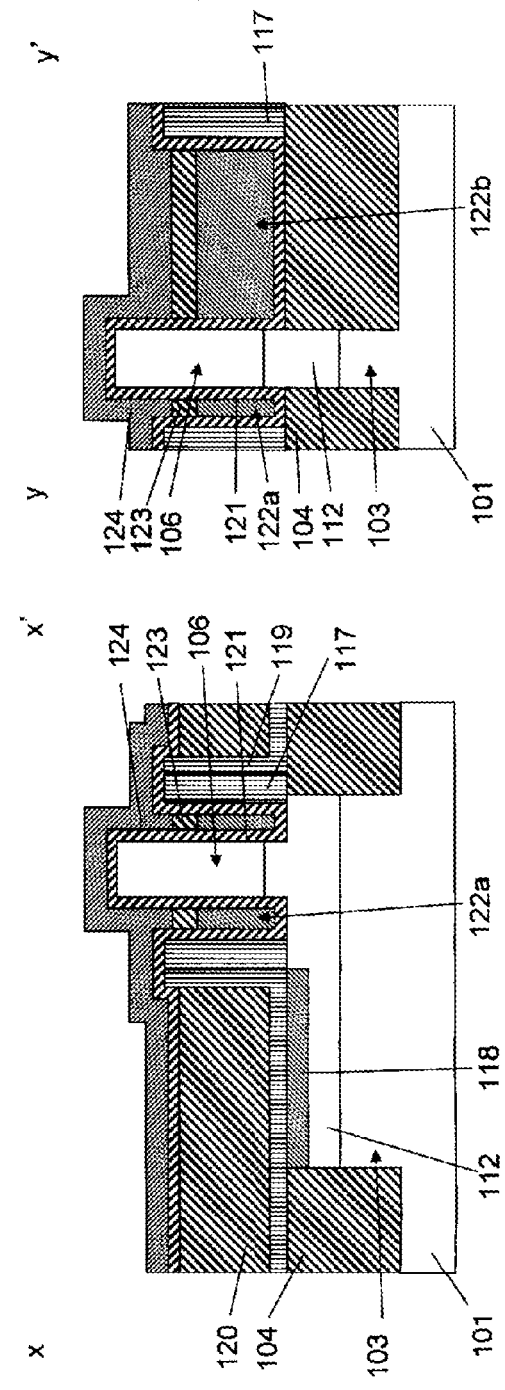
FIG. 30A
FIG. 30B
FIG. 30C

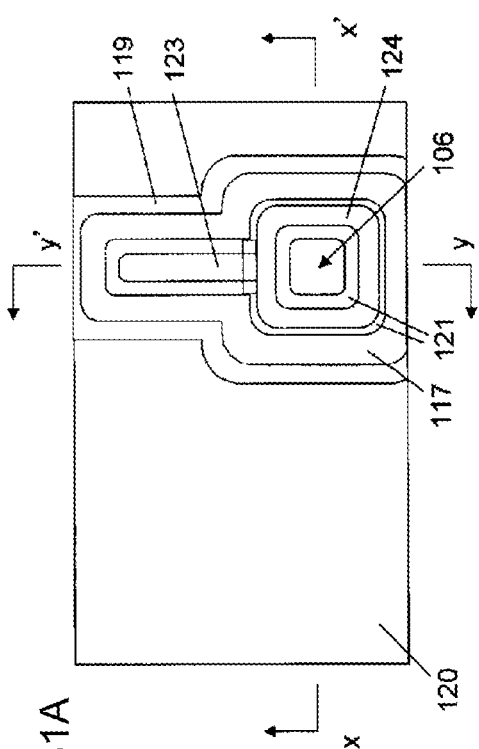
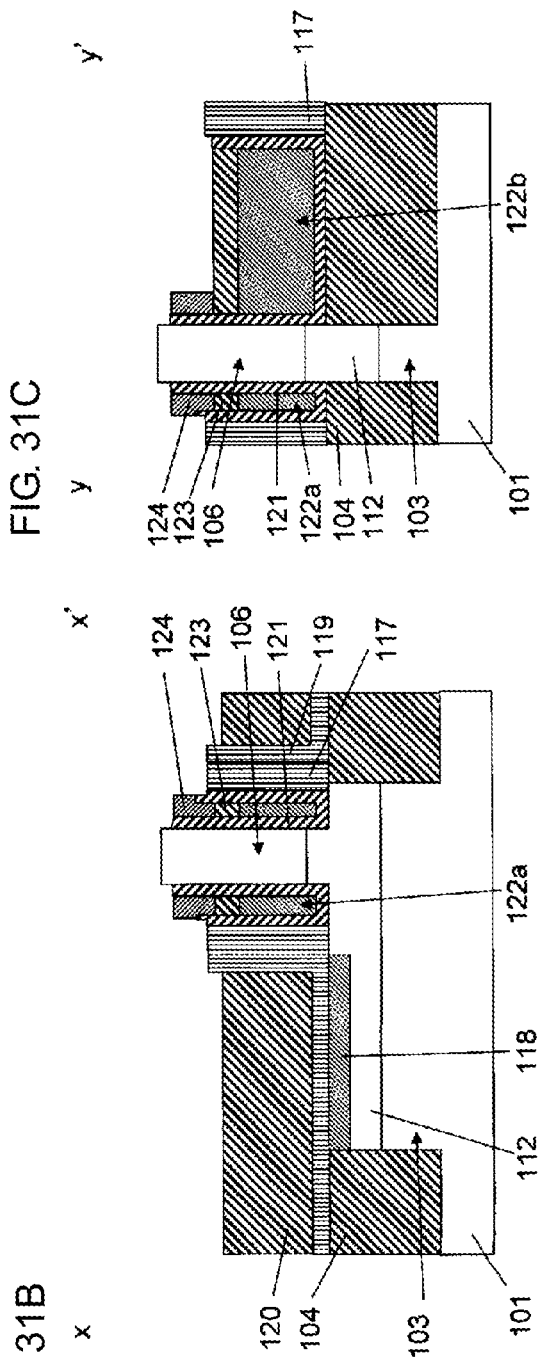
FIG. 31A
FIG. 31B
FIG. 31C

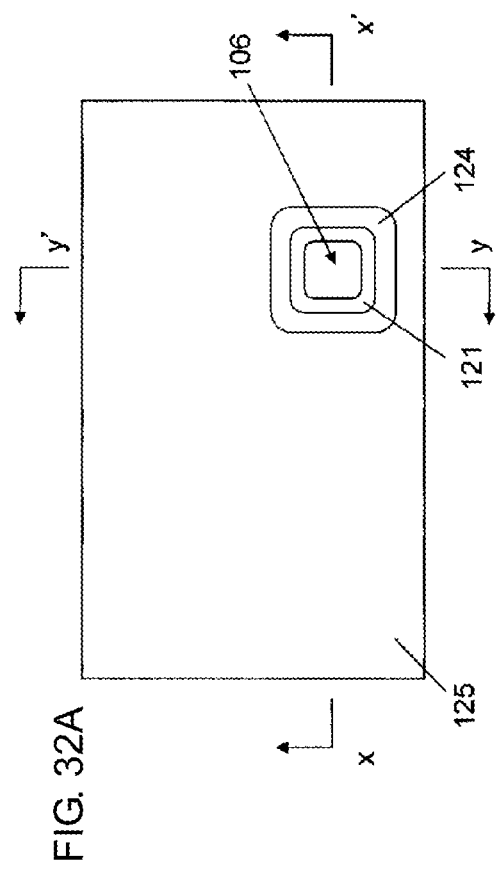
FIG. 32A
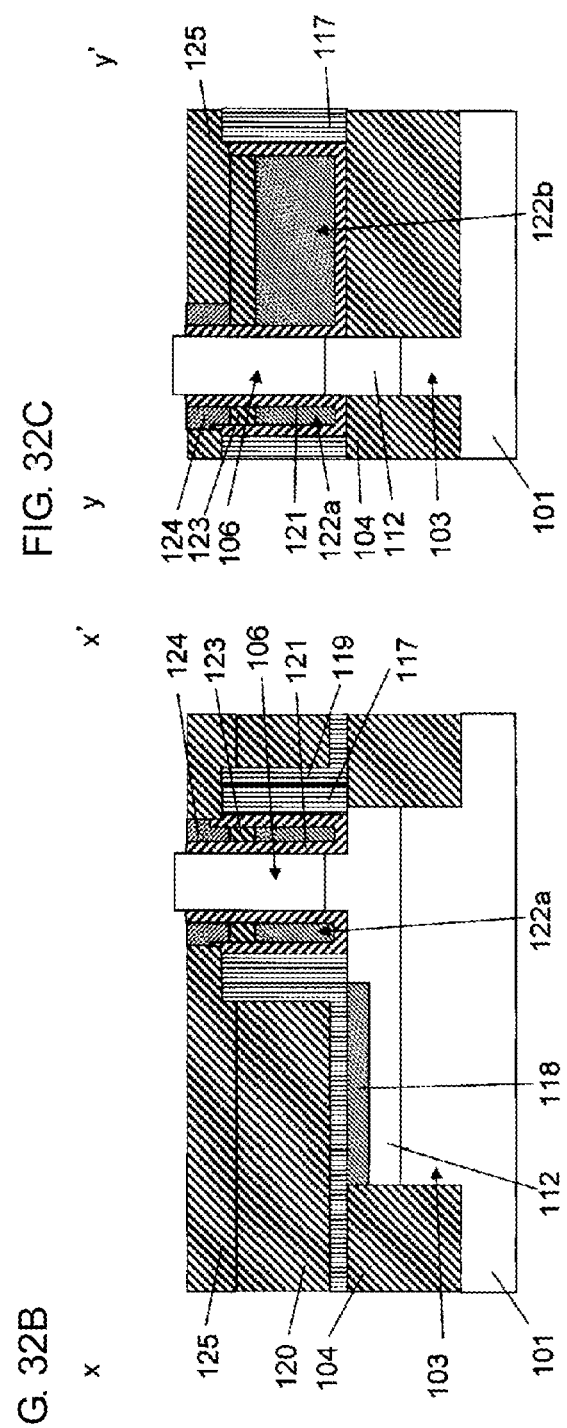
FIG. 32B
FIG. 32C

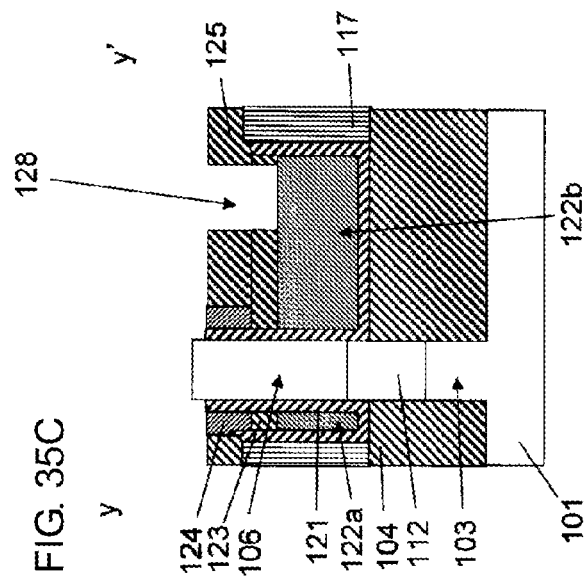
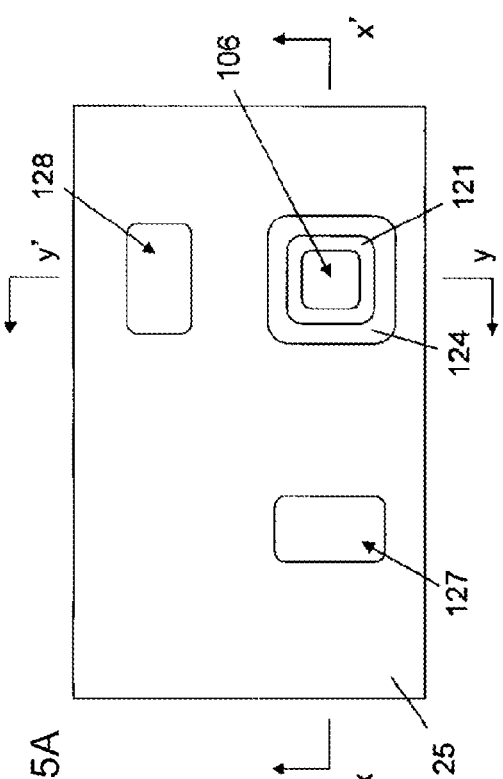
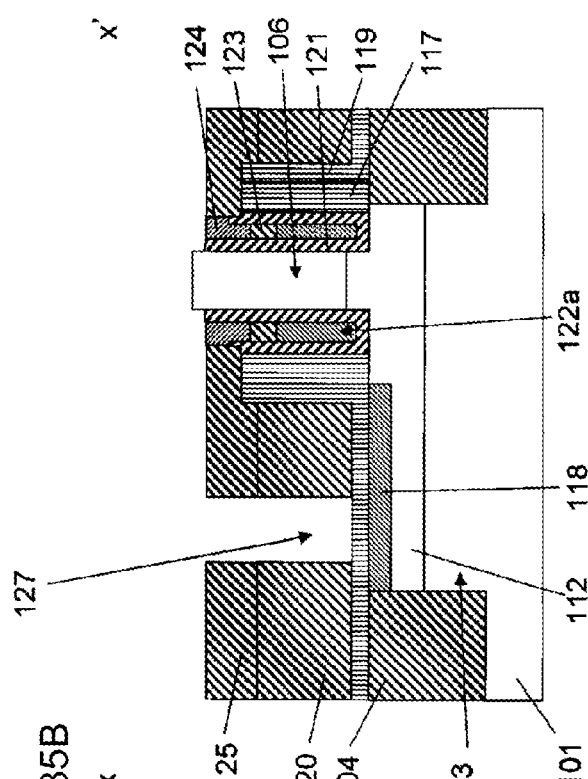

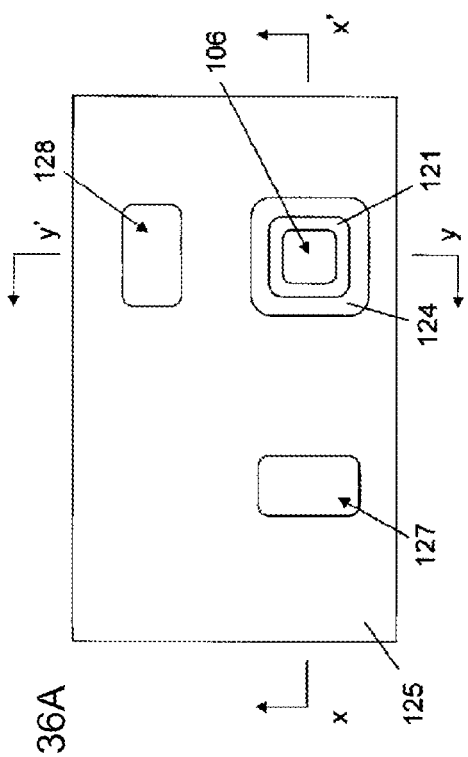
FIG. 36A
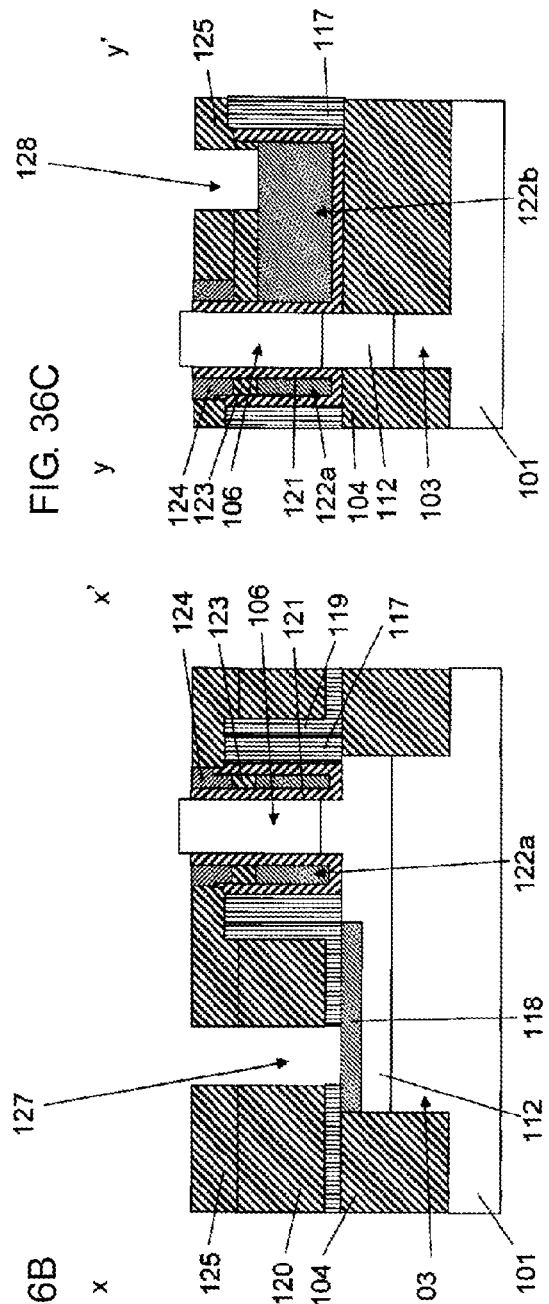
FIG. 36C
FIG. 36B

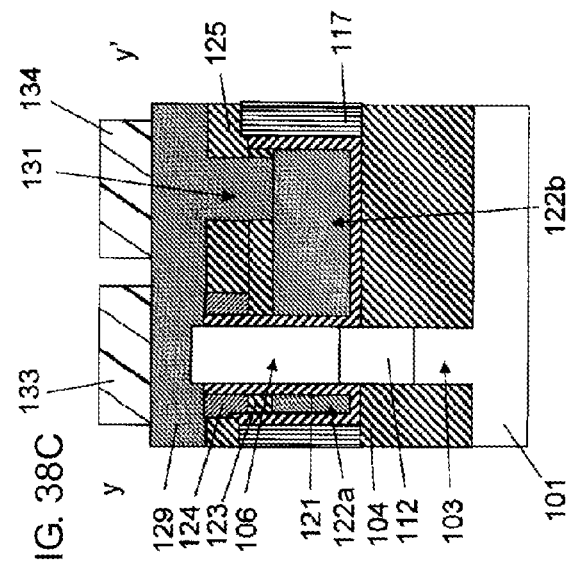
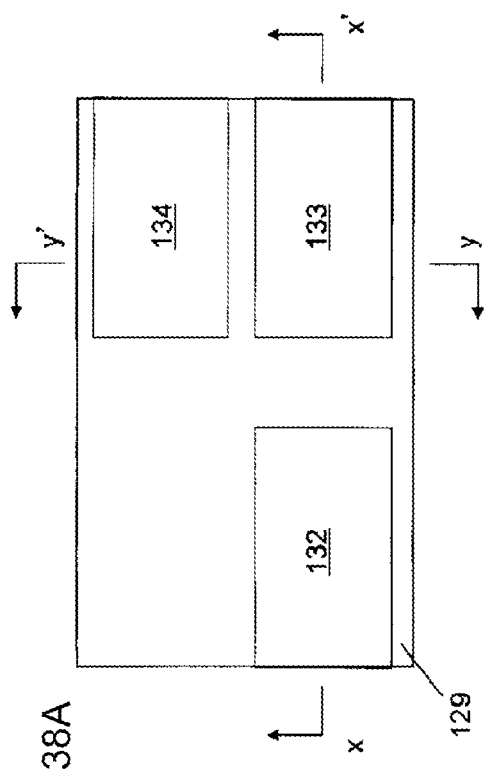
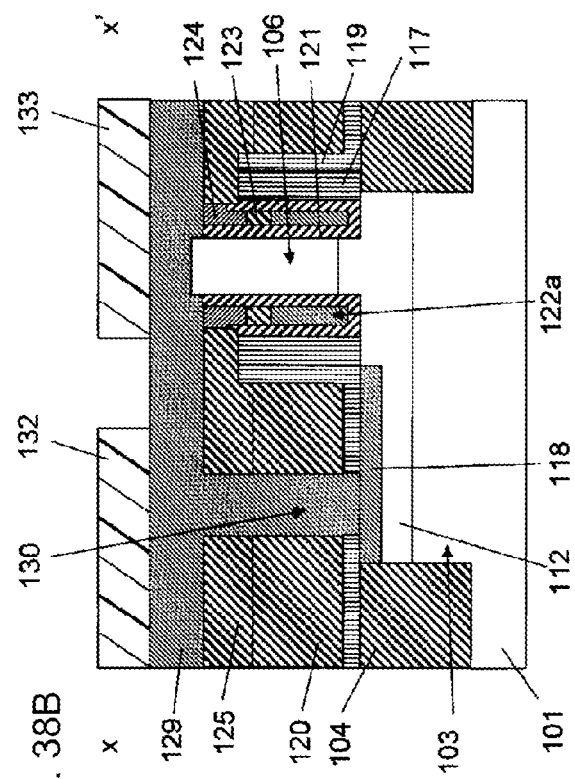
FIG. 38A
FIG. 38B
FIG. 38C

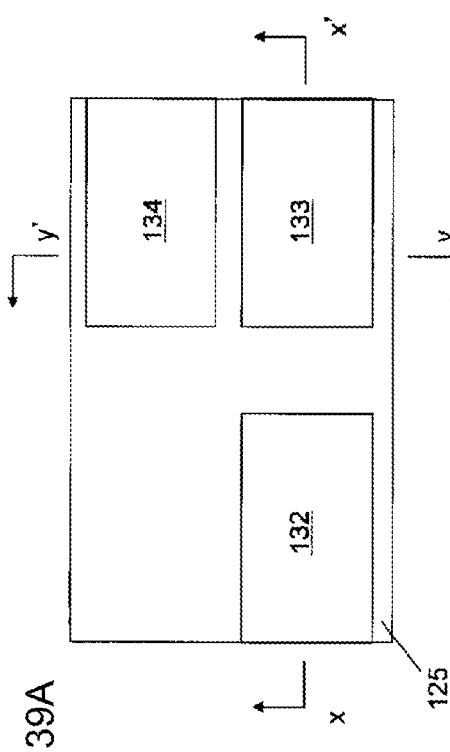
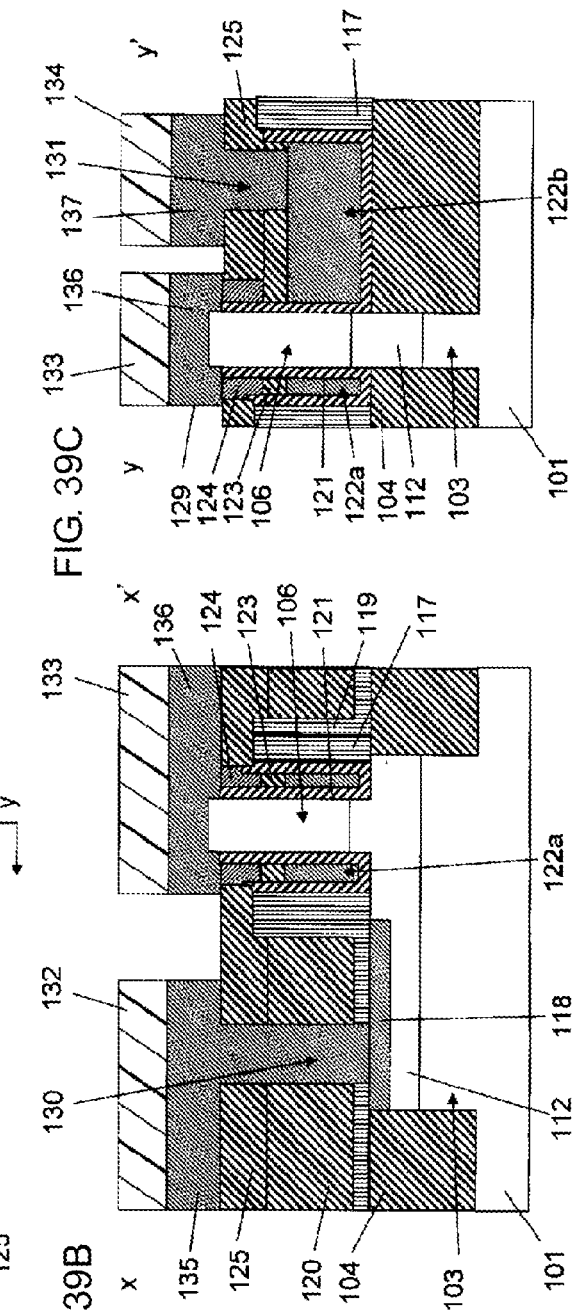
FIG. 39A
FIG. 39B
FIG. 39C

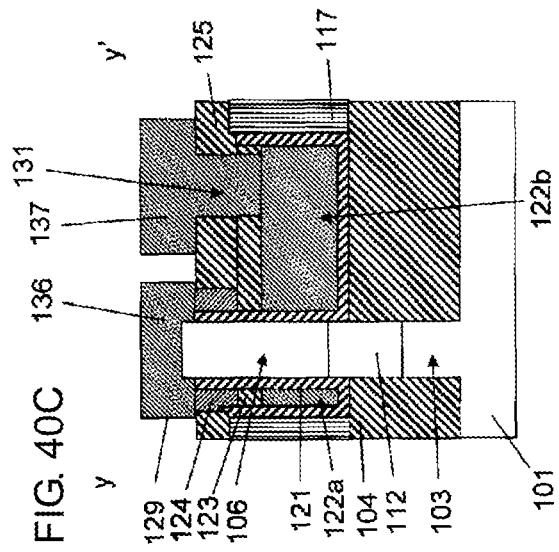
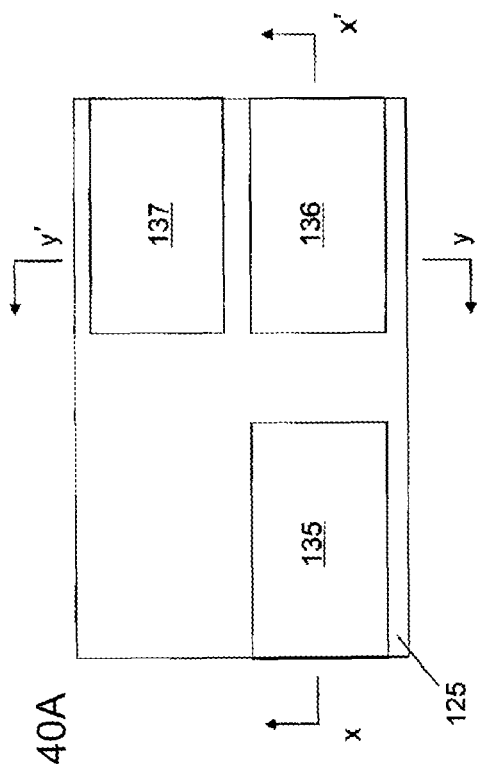
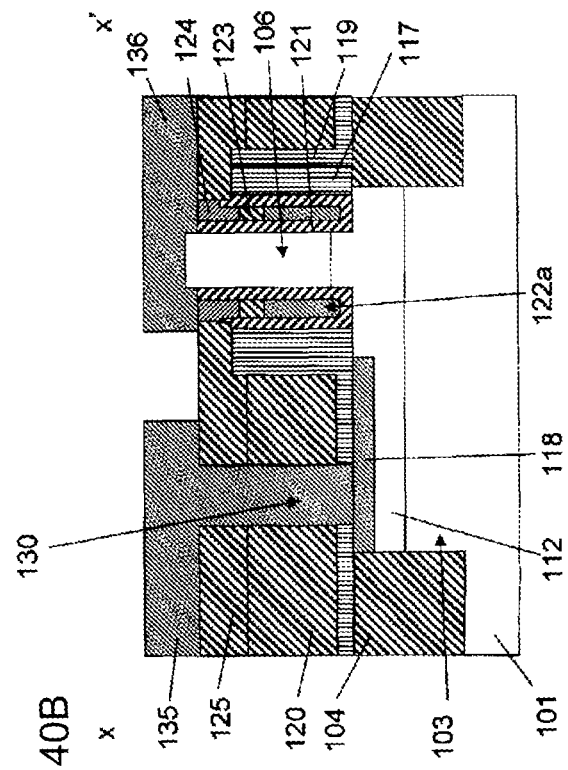

METHOD FOR PRODUCING SURROUNDING GATE SEMICONDUCTOR DEVICE

RELATED APPLICATIONS

The present application is a divisional application of U.S. patent application Ser. No. 14/755,317, filed Jun. 30, 2015, which is a continuation application of PCT/JP2013/062423, filed Apr. 26, 2013, the entire contents of which are incorporated herein by reference.

BACKGROUND

1. Technical Field

The present invention relates to a semiconductor device and a method for producing a semiconductor device.

2. Description of the Related Art

The degree of integration of semiconductor integrated circuits, in particular, integrated circuits that use metal-oxide-semiconductor (MOS) transistors, has been increasing. With the increase in the degree of integration, MOS transistors used in the integrated circuits have been miniaturized to the nanometer scale. With such miniaturization of MOS transistors, there may be a problem in that it becomes difficult to suppress a leak current and the area occupied by circuits is not easily decreased from the viewpoint of ensuring a required amount of current. In order to address this problem, a surrounding gate transistor (SGT) has been proposed in which a source, a gate, and a drain are arranged in a direction perpendicular to a substrate and the gate surrounds a pillar-shaped semiconductor layer (refer to, for example, Japanese Unexamined Patent Application Publication Nos. 2-71556, 2-188966, and 3-145761).

By using, as a gate electrode, a metal rather than polysilicon, the depletion can be suppressed and the resistance of the gate electrode can be decreased. However, it is necessary to use a production process in which, in steps after the formation of a metal gate, metal contamination due to the metal gate is constantly considered.

In a MOS transistor in the related art, in order to combine a metal gate process with a high-temperature process, a metal gate-last process in which a metal gate is formed after a high-temperature process has been employed in manufacturing of products (refer to, IEDM 2007, K. Mistry et. al, pp. 247-250). A gate is formed using polysilicon, and an interlayer insulating film is then deposited. Subsequently, the polysilicon gate is exposed by chemical-mechanical polishing, the polysilicon gate is etched, and a metal is then deposited. Therefore, also in an SGT, in order to combine a metal gate process with a high-temperature process, it is necessary to use a metal gate-last process in which a metal gate is formed after a high-temperature process. In an SGT, since an upper portion of a pillar-shaped silicon layer is located at a position higher than a gate, a suitable approach for using a metal gate-last process is necessary.

In the metal gate-last process, a polysilicon gate is formed, and a diffusion layer is then formed by ion implantation. In an SGT, since an upper portion of a pillar-shaped silicon layer is covered with a polysilicon gate, a suitable approach is necessary.

When a silicon pillar becomes thin, it becomes difficult for impurities to exist in the silicon pillar because the density of silicon is $5 \times 10^{22}$ atoms/cm$^3$.

In an SGT in the related art, it has been proposed that the threshold voltage be determined by changing the work function of a gate material while an impurity concentration of a channel be controlled to be as low as $10^{17}$ cm$^3$ or less (refer to, for example, Japanese Unexamined Patent Application Publication No. 2004-356314).

In a planar MOS transistor, it is disclosed that a sidewall in a LDD region is formed of polycrystalline silicon having the same conductivity type as a low-concentration layer, and that a surface carrier of the LDD region is induced due to the difference in work function thereof. With this structure, the impedance of the LDD region can be decreased compared with an LDD-type MOS transistor having an oxide film sidewall (refer to, for example, Japanese Unexamined Patent Application Publication No. 11-297984). Japanese Unexamined Patent Application Publication No. 11-297984 describes that the polycrystalline silicon sidewall is electrically insulated from a gate electrode. In addition, a drawing shows that the polycrystalline silicon sidewall and source/drain are insulated by an interlayer insulating film.

SUMMARY

Accordingly, it is an object of the present invention to provide a method for producing an SGT, the method being a gate-last process, and an SGT having a structure in which an upper portion of a pillar-shaped semiconductor layer is made to function as an n-type semiconductor layer or a p-type semiconductor layer due to the difference in work function between a metal and a semiconductor.

A method for producing a semiconductor device according to an aspect of the present invention includes a first step of forming a fin-shaped semiconductor layer on a semiconductor substrate, forming a first insulating film around the fin-shaped semiconductor layer, and forming a pillar-shaped semiconductor layer in an upper portion of the fin-shaped semiconductor layer; a second step of, after the first step, forming a second insulating film, a poly silicon gate electrode, and a polysilicon gate line, the second insulating film covering a periphery and an upper portion of the pillar-shaped semiconductor layer, the polysilicon gate electrode covering the second insulating film; a third step of, after the second step, forming a diffusion layer in an upper portion of the fin-shaped semiconductor layer and a lower portion of the pillar-shaped semiconductor layer; a fourth step of, after the third step, forming a metal-semiconductor compound in an upper portion of the diffusion layer formed in the upper portion of the fin-shaped semiconductor layer; a fifth step of, after the fourth step, depositing an interlayer insulating film, exposing the polysilicon gate electrode and the polysilicon gate line, etching the polysilicon gate electrode and the polysilicon gate line, subsequently depositing a first metal, and forming a metal gate electrode and a metal gate line; and a sixth step of, after the fifth step, forming a sidewall composed of a third metal on an upper side wall of the pillar-shaped semiconductor layer, in which the sidewall composed of the third metal is connected to an upper surface of the pillar-shaped semiconductor layer.

The first step may include forming, on a semiconductor substrate, a first resist for forming a fin-shaped semiconductor layer, etching the semiconductor substrate to form the fin-shaped semiconductor layer, removing the first resist, depositing a first insulating film around the fin-shaped semiconductor layer, etching back the first insulating film to expose an upper portion of the fin-shaped semiconductor layer, forming a second resist so as to be perpendicular to the fin-shaped semiconductor layer, etching the fin-shaped semiconductor layer, and removing the second resist to form a pillar-shaped semiconductor layer such that a portion where the fin-shaped semiconductor layer and the second resist intersect at right angles becomes the pillar-shaped semiconductor layer.

The second step may include, for a structure including the fin-shaped semiconductor layer formed on the semiconductor substrate, the first insulating film formed around the fin-shaped semiconductor layer, and the pillar-shaped semiconductor layer formed on the fin-shaped semiconductor layer, forming a second insulating film, depositing a polysilicon, planarizing the polysilicon such that an upper surface of the polysilicon after planarization is located at a position higher than the second insulating film located on the top of the pillar-shaped semiconductor layer, depositing a first nitride film, forming a third resist for forming a polysilicon gate electrode and a polysilicon gate line, etching the first nitride film, etching the polysilicon to form the polysilicon gate electrode and the polysilicon gate line, etching the second insulating film, and removing the third resist.

The fourth step may include depositing a second nitride film, etching the second nitride film to be left as a sidewall, depositing a second metal, and forming a metal-semiconductor compound in an upper portion of the diffusion layer formed in the upper portion of the fin-shaped semiconductor layer.

The fifth step may include depositing a third nitride film, depositing an interlayer insulating film and planarizing the interlayer insulating film, exposing the second nitride film and the third nitride film, removing the exposed second nitride film and the third nitride film to expose the polysilicon gate electrode and the polysilicon gate line, removing the polysilicon gate electrode, the polysilicon gate line, and the second insulating film, depositing a gate insulating film, embedding a first metal in a portion from which the polysilicon gate electrode and the polysilicon gate line have been removed, and forming a metal gate electrode and a metal gate line by etching the first metal to expose the gate insulating film on an upper portion of the pillar-shaped semiconductor layer.

The sixth step may include exposing an upper portion of the pillar-shaped semiconductor layer, depositing a third metal, and etching the third metal to form a sidewall composed of the third metal on an upper side wall of the pillar-shaped semiconductor layer.

A semiconductor device according to another aspect of the present invention includes a fin-shaped semiconductor layer formed on a semiconductor substrate; a first insulating film formed around the fin-shaped semiconductor layer; a pillar-shaped semiconductor layer formed on the fin-shaped semiconductor layer; a diffusion layer formed in an upper portion of the fin-shaped semiconductor layer and a lower portion of the pillar-shaped semiconductor layer; a metal-semiconductor compound formed in an upper portion of the diffusion layer that is formed in the upper portion of the fin-shaped semiconductor layer; a gate insulating film formed around the pillar-shaped semiconductor layer; a metal gate electrode formed around the gate insulating film; a metal gate line connected to the metal gate electrode; and a sidewall composed of a third metal and formed on an upper side wall of the pillar-shaped semiconductor layer, in which the sidewall composed of the third metal is connected to an upper surface of the pillar-shaped semiconductor layer.

A width of the pillar-shaped semiconductor layer may be equal to a shorter width of the fin-shaped semiconductor layer.

The semiconductor layers may be silicon layers.

The diffusion layer may be an n-type diffusion layer, and the third metal may have a work function in a range of 4.0 to 4.2 eV.

The diffusion layer may be a p-type diffusion layer, and the third metal may have a work function in a range of 5.0 to 5.2 eV.

The sidewall composed of the third metal may be formed on the upper side wall of the pillar-shaped semiconductor layer with an insulating film therebetween.

According to the aspects of the present invention, it is possible to provide a method for producing an SGT, the method being a gate-last process, and an SGT having a structure in which an upper portion of a pillar-shaped semiconductor layer is made to function as an n-type semiconductor layer or a p-type semiconductor layer due to the difference in work function between a metal and a semiconductor.

In the case where a metal gate-last process is applied to an SGT, an upper portion of a pillar-shaped semiconductor layer is covered with a polysilicon gate and thus it is difficult to form a diffusion layer in the upper portion of the pillar-shaped semiconductor layer. Accordingly, before the formation of the polysilicon gate, the diffusion layer is formed in the upper portion of the pillar-shaped semiconductor layer. In contrast, according to the aspects of the present invention, an upper portion of the pillar-shaped semiconductor layer can be made to function as an n-type semiconductor layer or a p-type semiconductor layer due to the difference in work function between a metal and a semiconductor without forming a diffusion layer in the upper portion of a pillar-shaped semiconductor layer. Therefore, a step of forming a diffusion layer in an upper portion of the pillar-shaped semiconductor layer can be omitted.

BRIEF DESCRIPTION OF THE DRAWING

FIG. 1A is a plan view of a semiconductor device according to the present invention, FIG. 1B is a cross-sectional view taken along line x-x' in FIG. 1A, and FIG. 1C is a cross-sectional view taken along line y-y' in FIG. 1A.

FIG. 2A is a plan view illustrating a method for producing a semiconductor device according to the present invention, FIG. 2B is a cross-sectional view taken along line x-x' in FIG. 2A, and FIG. 2C is a cross-sectional view taken along line y-y' in FIG. 2A.

FIG. 3A is a plan view illustrating the method for producing a semiconductor device according to the present invention, FIG. 3B is a cross-sectional view taken along line x-x' in FIG. 3A, and FIG. 3C is a cross-sectional view taken along line y-y' in FIG. 3A.

FIG. 4A is a plan view illustrating the method for producing a semiconductor device according to the present invention, FIG. 4B is a cross-sectional view taken along line x-x' in FIG. 4A, and FIG. 4C is a cross-sectional view taken along line y-y' in FIG. 4A.

FIG. 6A is a plan view illustrating the method for producing a semiconductor device according to the present invention, FIG. 6B is a cross-sectional view taken along line x-x' in FIG. 6A, and FIG. 6C is a cross-sectional view taken along line y-y' in FIG. 6A.

FIG. 7A is a plan view illustrating the method for producing a semiconductor device according to the present invention, FIG. 7B is a cross-sectional view taken along line x-x' in FIG. 7A, and FIG. 7C is a cross-sectional view taken along line y-y' in FIG. 7A.

FIG. 8A is a plan view illustrating the method for producing a semiconductor device according to the present invention, FIG. 8B is a cross-sectional view taken along line x-x' in FIG. 8A, and FIG. 8C is a cross-sectional view taken along line y-y' in FIG. 8A.

FIG. 9A is a plan view illustrating the method for producing a semiconductor device according to the present invention, FIG. 9B is a cross-sectional view taken along line x-x' in FIG. 9A, and FIG. 9C is a cross-sectional view taken along line y-y' in FIG. 9A.

FIG. 11A is a plan view illustrating the method for producing a semiconductor device according to the present invention, FIG. 11B is a cross-sectional view taken along line x-x' in FIG. 11A, and FIG. 11C is a cross-sectional view taken along line y-y' in FIG. 11A.

FIG. 12A is a plan view illustrating the method for producing a semiconductor device according to the present invention, FIG. 12B is a cross-sectional view taken along line x-x' in FIG. 12A, and FIG. 12C is a cross-sectional view taken along line y-y' in FIG. 12A.

FIG. 13A is a plan view illustrating the method for producing a semiconductor device according to the present invention, FIG. 13B is a cross-sectional view taken along line x-x' in FIG. 13A, and FIG. 13C is a cross-sectional view taken along line y-y' in FIG. 13A.

FIG. 14A is a plan view illustrating the method for producing a semiconductor device according to the present invention, FIG. 14B is a cross-sectional view taken along line x-x' in FIG. 14A, and FIG. 14C is a cross-sectional view taken along line y-y' in FIG. 14A.

FIG. 15A is a plan view illustrating the method for producing a semiconductor device according to the present invention, FIG. 15B is a cross-sectional view taken along line x-x' in FIG. 15A, and FIG. 15C is a cross-sectional view taken along line y-y' in FIG. 15A.

FIG. 20A is a plan view illustrating the method for producing a semiconductor device according to the present invention, FIG. 20B is a cross-sectional view taken along line x-x' in FIG. 20A, and FIG. 20C is a cross-sectional view taken along line y-y' in FIG. 20A.

FIG. 21A is a plan view illustrating the method for producing a semiconductor device according to the present invention, FIG. 21B is a cross-sectional view taken along line x-x' in FIG. 21A, and FIG. 21C is a cross-sectional view taken along line y-y' in FIG. 21A.

FIG. 23A is a plan view illustrating the method for producing a semiconductor device according to the present invention, FIG. 23B is a cross-sectional view taken along line x-x' in FIG. 23A, and FIG. 23C is a cross-sectional view taken along line y-y' in FIG. 23A.

FIG. 24A is a plan view illustrating the method for producing a semiconductor device according to the present invention, FIG. 24B is a cross-sectional view taken along line x-x' in FIG. 24A, and FIG. 24C is a cross-sectional view taken along line y-y' in FIG. 24A.

FIG. 25A is a plan view illustrating the method for producing a semiconductor device according to the present invention, FIG. 25B is a cross-sectional view taken along line x-x' in FIG. 25A, and FIG. 25C is a cross-sectional view taken along line y-y' in FIG. 25A.

FIG. 26A is a plan view illustrating the method for producing a semiconductor device according to the present invention, FIG. 26B is a cross-sectional view taken along line x-x' in FIG. 26A, and FIG. 26C is a cross-sectional view taken along line y-y' in FIG. 26A.

FIG. 27A is a plan view illustrating the method for producing a semiconductor device according to the present invention, FIG. 27B is a cross-sectional view taken along line x-x' in FIG. 27A, and FIG. 27C is a cross-sectional view taken along line y-y' in FIG. 27A.

FIG. 29A is a plan view illustrating the method for producing a semiconductor device according to the present invention, FIG. 29B is a cross-sectional view taken along line x-x' in FIG. 29A, and FIG. 29C is a cross-sectional view taken along line y-y' in FIG. 29A.

FIG. 30A is a plan view illustrating the method for producing a semiconductor device according to the present invention, FIG. 30B is a cross-sectional view taken along line x-x' in FIG. 30A, and FIG. 30C is a cross-sectional view taken along line y-y' in FIG. 30A.

FIG. 31A is a plan view illustrating the method for producing a semiconductor device according to the present invention, FIG. 31B is a cross-sectional view taken along line x-x' in FIG. 31A, and FIG. 31C is a cross-sectional view taken along line y-y' in FIG. 31A.

FIG. 32A is a plan view illustrating the method for producing a semiconductor device according to the present invention, FIG. 32B is a cross-sectional view taken along line x-x' in FIG. 32A, and FIG. 32C is a cross-sectional view taken along line y-y' in FIG. 32A.

FIG. 35A is a plan view illustrating the method for producing a semiconductor device according to the present invention, FIG. 35B is a cross-sectional view taken along line x-x' in FIG. 35A, and FIG. 35C is a cross-sectional view taken along line y-y' in FIG. 35A.

FIG. 36A is a plan view illustrating the method for producing a semiconductor device according to the present invention, FIG. 36B is a cross-sectional view taken along line x-x' in FIG. 36A, and FIG. 36C is a cross-sectional view taken along line y-y' in FIG. 36A.

FIG. 38A is a plan view illustrating the method for producing a semiconductor device according to the present invention, FIG. 38B is a cross-sectional view taken along line x-x' in FIG. 38A, and FIG. 38C is a cross-sectional view taken along line y-y' in FIG. 38A.

FIG. 39A is a plan view illustrating the method for producing a semiconductor device according to the present invention, FIG. 39B is a cross-sectional view taken along line x-x' in FIG. 39A, and FIG. 39C is a cross-sectional view taken along line y-y' in FIG. 39A.

FIG. 40A is a plan view illustrating the method for producing a semiconductor device according to the present invention, FIG. 40B is a cross-sectional view taken along line x-x' in FIG. 40A, and FIG. 40C is a cross-sectional view taken along line y-y' in FIG. 40A.

DETAILED DESCRIPTION OF THE PREFERRED EMBODIMENTS

A production process for forming a structure of an SGT according to an embodiment of the present invention will now be described with reference to FIGS. 2A to 40C.

First, a first step will be described. The first step includes forming, on a semiconductor substrate, a first resist for forming a fin-shaped semiconductor layer, etching the semiconductor substrate to form the fin-shaped semiconductor layer, removing the first resist, depositing a first insulating film around the fin-shaped semiconductor layer, etching back the first insulating film to expose an upper portion of the fin-shaped semiconductor layer, forming a second resist so as to be perpendicular to the fin-shaped semiconductor layer, etching the fin-shaped semiconductor layer, and removing the second resist to form a pillar-shaped semiconductor layer such that a portion where the fin-shaped semiconductor layer and the second resist intersect at right angles becomes the pillar-shaped semiconductor layer. In the present embodiment, silicon is used as the material of the semiconductor substrate. Alternatively, a semiconductor material other than silicon may also be used.

As illustrated in FIGS. 2A to 2C, a first resist 102 for forming a fin-shaped silicon layer is formed on a silicon substrate 101.

As illustrated in FIGS. 3A to 3C, the silicon substrate 101 is etched to form a fin-shaped silicon layer 103. In the present embodiment, the fin-shaped silicon layer 103 is formed by using a resist as a mask. Alternatively, a hard mask such as an oxide film or a nitride film may also be used as the mask.

As illustrated in FIGS. 4A to 4C, the first resist 102 is removed.

Figure 5A:
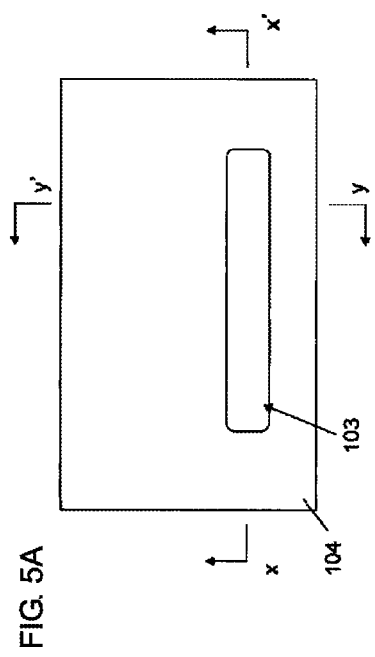
FIG. 5A is a plan view illustrating the method for producing a semiconductor device according to the present invention.
Figure 5C:
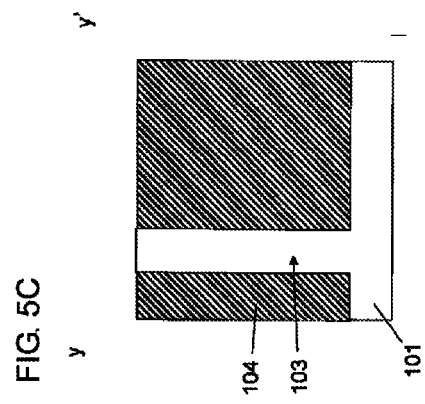
FIG. 5C is a cross-sectional view taken along line y-y' in FIG. 5A.
Figure 5B:
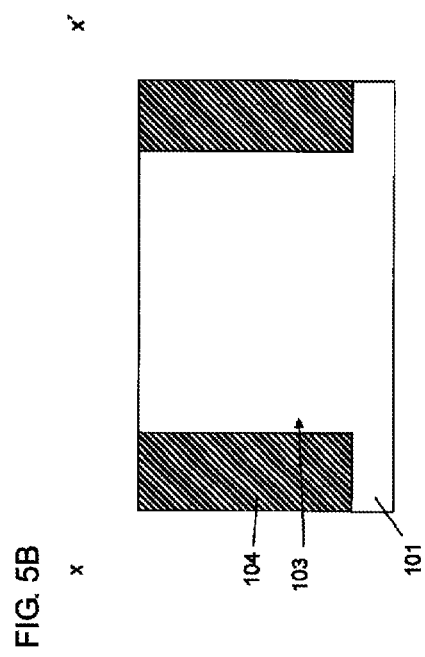
FIG. 5B is a cross-sectional view taken along line x-x' in FIG. 5A.

As illustrated in FIGS. 5A to 5C, a first insulating film 104 is deposited around the fin-shaped silicon layer 103. The first insulating film 104 may be an oxide film formed by a high-density plasma or an oxide film formed by low-pressure chemical vapor deposition.

As illustrated in FIGS. 6A to 6C, the first insulating film 104 is etched back to expose an upper portion of the fin-shaped silicon layer 103.

As illustrated in FIGS. 7A to 7C, a second resist 105 is formed so as to be perpendicular to the fin-shaped silicon layer 103. A portion where the fin-shaped silicon layer 103 and the second resist 105 intersect at right angles corresponds to a portion that becomes a pillar-shaped silicon layer. Since a line-shaped resist can be used in this case, the resist does not easily fall over after pattering. Therefore, a stable process is provided.

As illustrated in FIGS. 8A to 8C, the fin-shaped silicon layer 103 is etched. The portion where the fin-shaped silicon layer 103 and the second resist 105 intersect at right angles becomes a pillar-shaped silicon layer 106. Accordingly, a width of the pillar-shaped silicon layer 106 is equal to a width of the fin-shaped silicon layer 103. This step provides a structure in which the pillar-shaped silicon layer 106 is formed in an upper portion of the fin-shaped silicon layer 103 and the first insulating film 104 is formed around the fin-shaped silicon layer 103.

As illustrated in FIGS. 9A to 9C, the second resist 105 is removed.

The description has been made of the first step of forming, on a semiconductor substrate, a first resist for forming a fin-shaped semiconductor layer, etching the semiconductor substrate to form the fin-shaped semiconductor layer, removing the first resist, depositing a first insulating film around the fin-shaped semiconductor layer, etching back the first insulating film to expose an upper portion of the fin-shaped semiconductor layer, forming a second resist so as to be perpendicular to the fin-shaped semiconductor layer, etching the fin-shaped semiconductor layer, and removing the second resist to form a pillar-shaped semiconductor layer such that a portion where the fin-shaped semiconductor layer and the second resist intersect at right angles becomes the pillar-shaped semiconductor layer.

Next, a second step will be described. The second step includes forming a second insulating film, depositing a polysilicon, planarizing the polysilicon such that an upper surface of the polysilicon after planarization is located at a position higher than the second insulating film located on the top of the pillar-shaped semiconductor layer, depositing a first nitride film, forming a third resist for forming a polysilicon gate electrode and a polysilicon gate line, etching the first nitride film, etching the polysilicon to form the polysilicon gate electrode and the polysilicon gate line, etching the second insulating film, and removing the third resist.

Figure 10A:
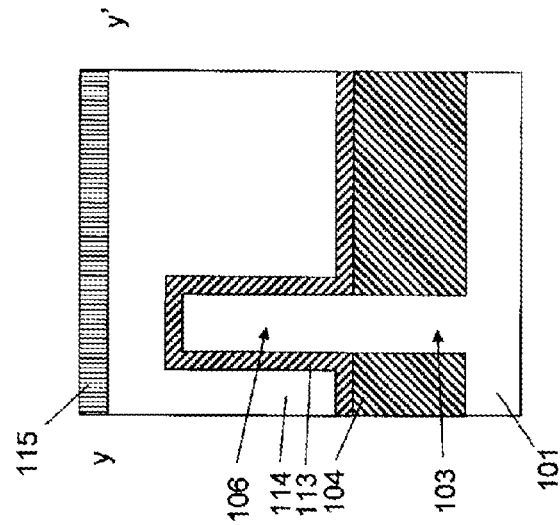
FIG. 10A is a plan view illustrating the method for producing a semiconductor device according to the present invention.
Figure 10B:
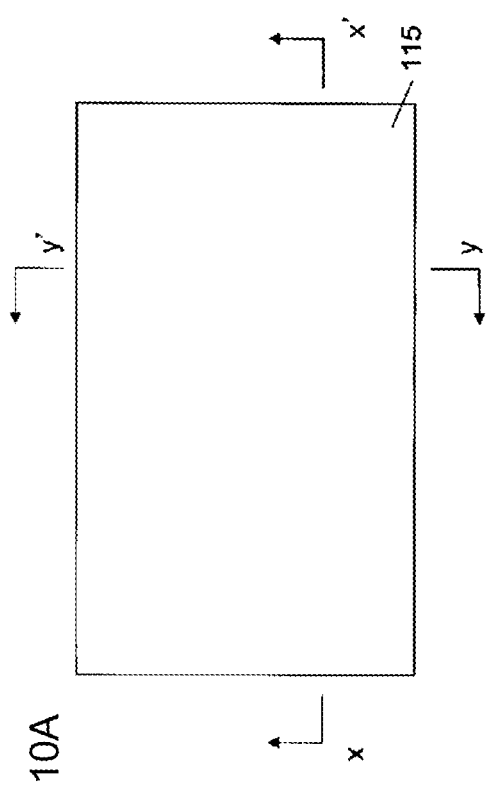
FIG. 10B is a cross-sectional view taken along line x-x' in FIG. 10A.
Figure 10C:
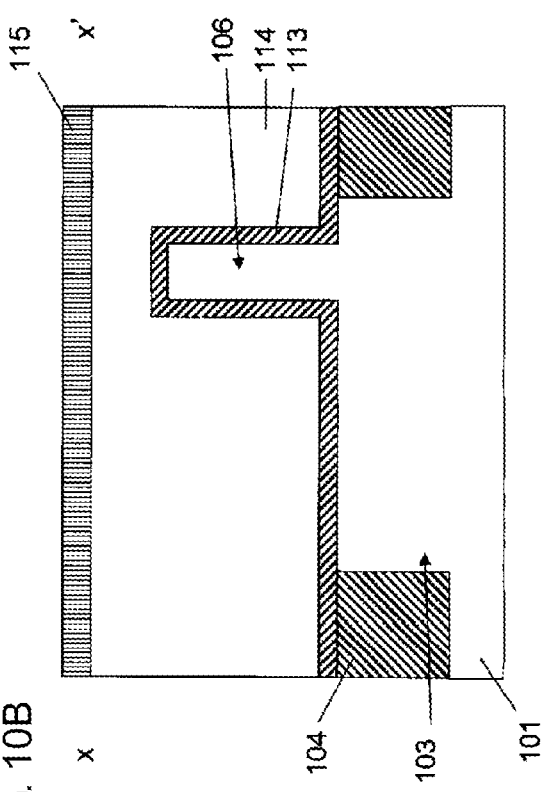
FIG. 10C is a cross-sectional view taken along line y-y' in FIG. 10A.

As illustrated in FIGS. 10A to 10C, a second insulating film 113 is formed, and a polysilicon 114 is deposited and planarized. An upper surface of the polysilicon 114 after planarization is located at a position higher than the second insulating film 113 located on the top of the pillar-shaped silicon layer 106. With this structure, after an interlayer insulating film is deposited, when a polysilicon gate electrode and a polysilicon gate line are exposed by chemical-mechanical polishing, the top of the pillar-shaped silicon layer is not exposed by the chemical-mechanical polishing. The second insulating film 113 is preferably an oxide film formed by deposition or a thermally oxidized film. A first nitride film 115 is deposited. This first nitride film 115 is a film that inhibits the formation of a silicide in upper portions of a polysilicon gate electrode and a polysilicon gate line when a silicide is formed in an upper portion of the fin-shaped silicon layer.

As illustrated in FIGS. 11A to 11C, a third resist 116 for forming a polysilicon gate electrode and a polysilicon gate line is formed. A portion that is to become a gate line preferably intersects the fin-shaped silicon layer 103 at right angles. This is because the parasitic capacitance between the gate line and the substrate is decreased.

As illustrated in FIGS. 12A to 12C, the first nitride film 115 is etched.

As illustrated in FIGS. 13A to 13C, the polysilicon 114 is etched to form a polysilicon gate electrode 114a and a polysilicon gate line 114b.

As illustrated in FIGS. 14A to 14C, the second insulating film 113 is etched.

As illustrated in FIGS. 15A to 15C, the third resist 116 is removed.

The description has been made of the second of forming a second insulating film, depositing a polysilicon, planarizing the polysilicon such that an upper surface of the polysilicon after planarization is located at a position higher than the second insulating film located on the top of the pillar-shaped semiconductor layer, depositing a first nitride film, forming a third resist for forming a polysilicon gate electrode and a polysilicon gate line, etching the first nitride film, etching the polysilicon to form the polysilicon gate electrode and the polysilicon gate line, etching the second insulating film, and removing the third resist.

Next, a third step will be described. The third step includes forming a diffusion layer in an upper portion of the fin-shaped semiconductor layer and a lower portion of the pillar-shaped semiconductor layer.

Figure 16A:
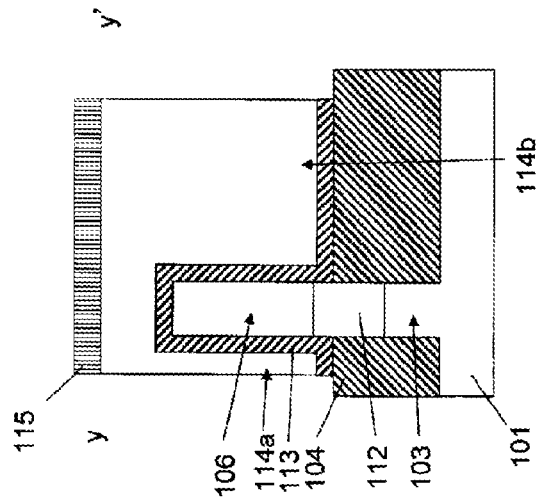
FIG. 16A is a plan view illustrating the method for producing a semiconductor device according to the present invention.
Figure 16B:
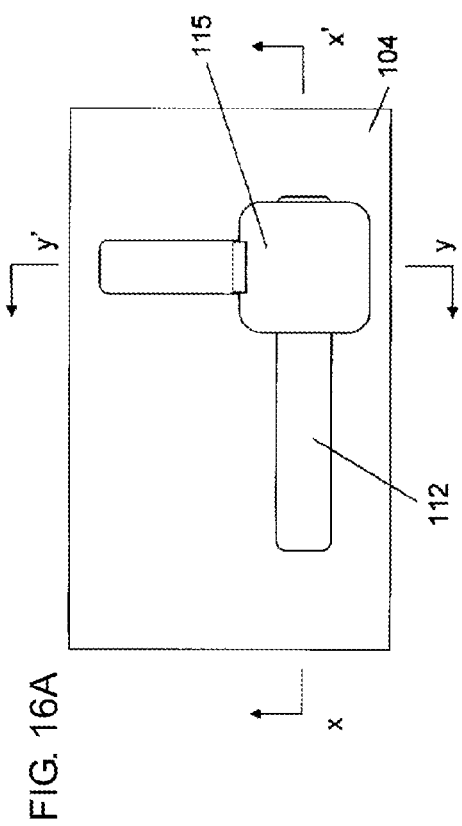
FIG. 16B is a cross-sectional view taken along line x-x' in FIG. 16A.
Figure 16C:
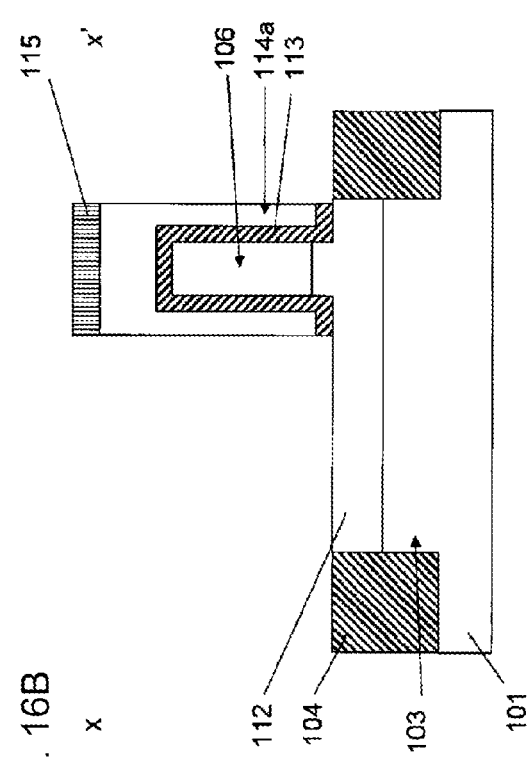
FIG. 16C is a cross-sectional view taken along line y-y' in FIG. 16A.

As illustrated in FIGS. 16A to 16C, a diffusion layer 112 is formed in an upper portion of the fin-shaped silicon layer 103 and a lower portion of the pillar-shaped silicon layer 106 by implanting an impurity such as arsenic or phosphorus in the case of an n-MOS or boron or $BF_2$ in the case of a p-MOS, and conducting heat treatment. In this case, a diffusion layer is not formed in an upper portion of the pillar-shaped silicon layer 106 because the upper portion the pillar-shaped silicon layer 106 is covered with the polysilicon gate electrode 114a.

The description has been made of the third step of forming a diffusion layer in an upper portion of the fin-shaped semiconductor layer and a lower portion of the pillar-shaped semiconductor layer.

Next, a fourth step will be described. The fourth step includes depositing a second nitride film, etching the second nitride film to be left as a sidewall, depositing a second metal, and forming a metal-semiconductor compound in an upper portion of the diffusion layer formed in the upper portion of the fin-shaped semiconductor layer.

Figure 17A:
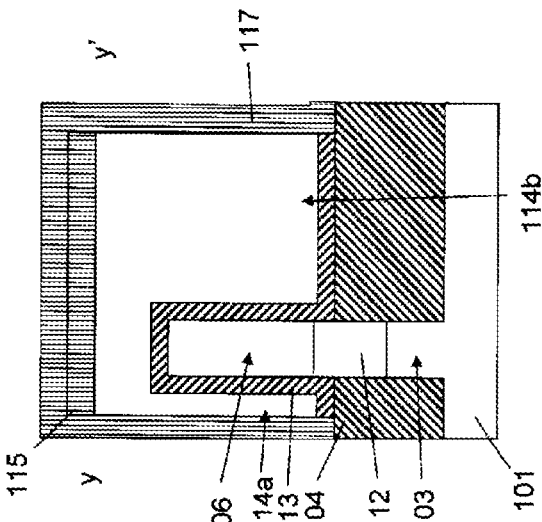
FIG. 17A is a plan view illustrating the method for producing a semiconductor device according to the present invention.
Figure 17B:
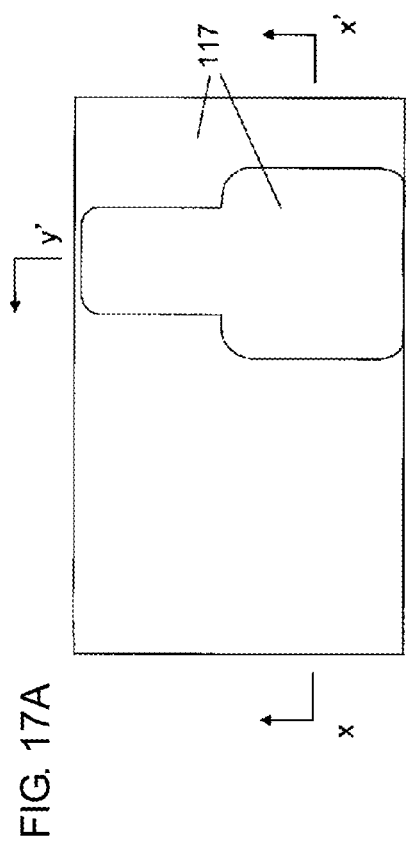
FIG. 17B is a cross-sectional view taken along line x-x' in FIG. 17A.
Figure 17C:
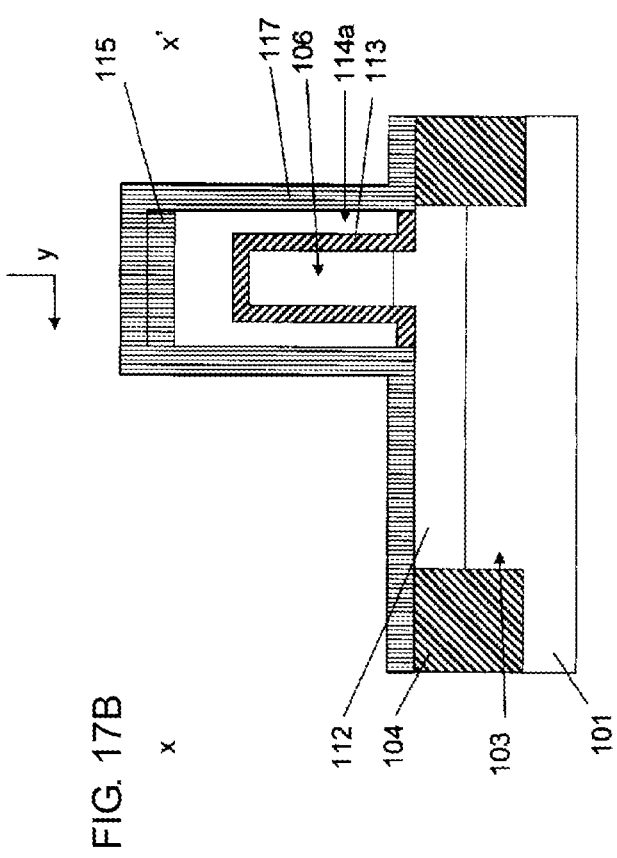
FIG. 17C is a cross-sectional view taken along line y-y' in FIG. 17A.

As illustrated in FIGS. 17A to 17C, a second nitride film 117 is deposited.

Figure 18A:
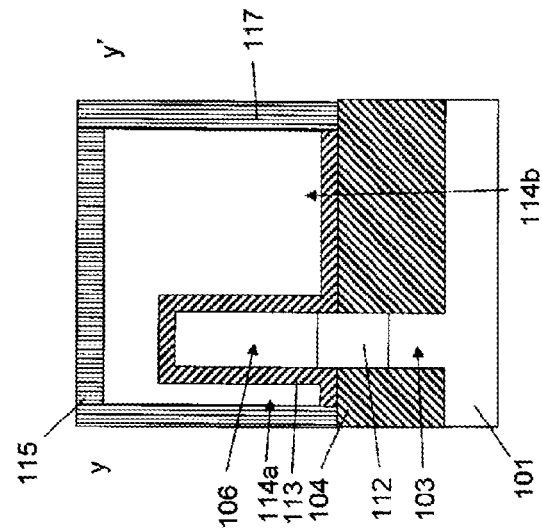
FIG. 18A is a plan view illustrating the method for producing a semiconductor device according to the present invention.
Figure 18B:
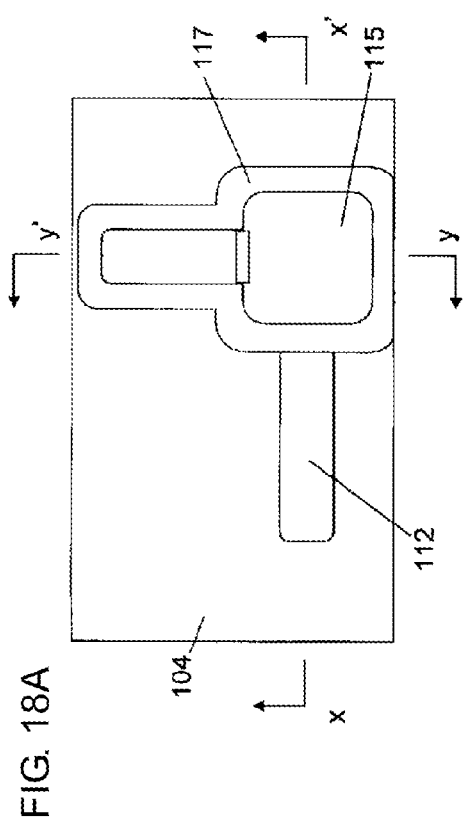
FIG. 18B is a cross-sectional view taken along line x-x' in FIG. 18A.
Figure 18C:
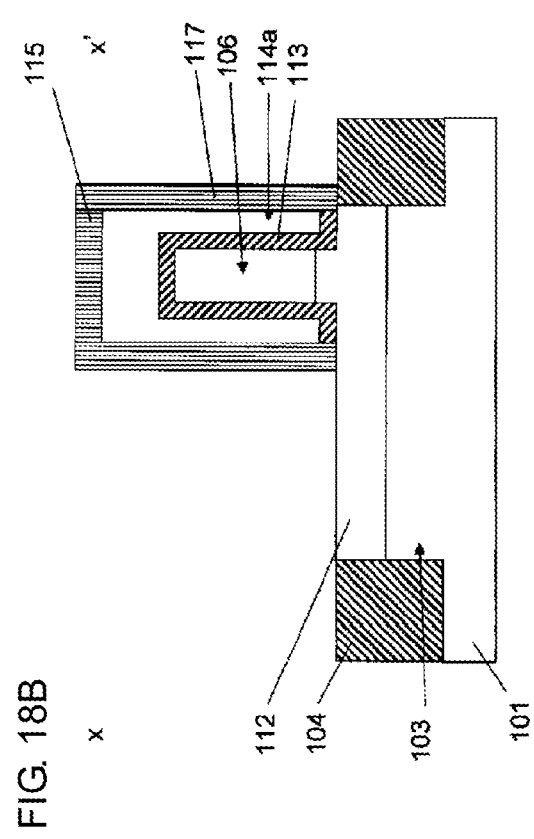
FIG. 18C is a cross-sectional view taken along line y-y' in FIG. 18A.

As illustrated in FIGS. 18A to 18C, the second nitride film 117 is etched to be left as a sidewall.

Figure 19A:
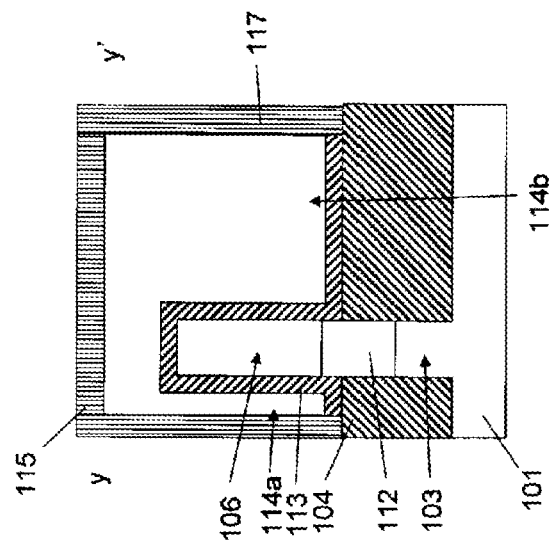
FIG. 19A is a plan view illustrating the method for producing a semiconductor device according to the present invention.
Figure 19B:
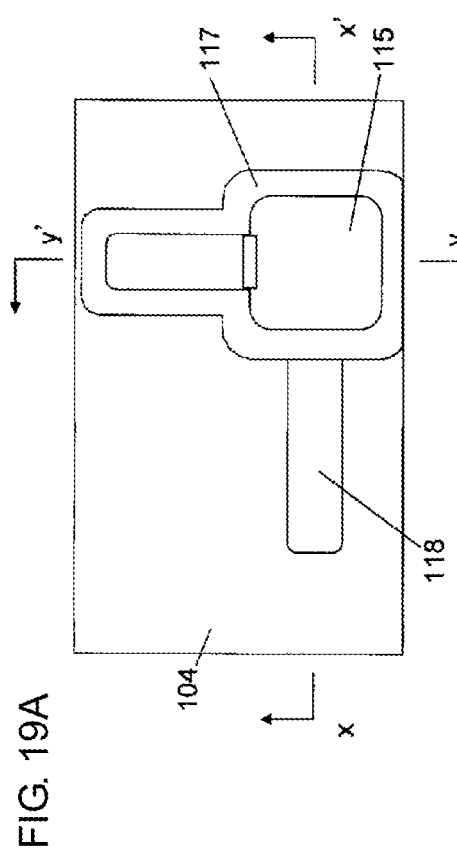
FIG. 19B is a cross-sectional view taken along line x-x' in FIG. 19A.
Figure 19C:
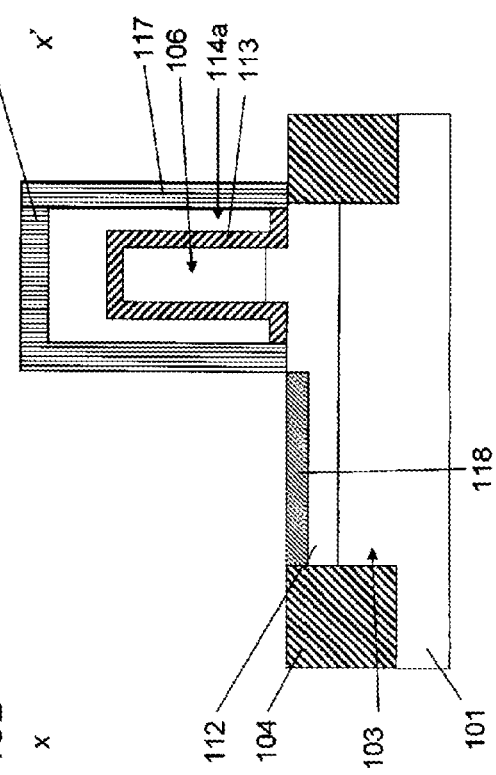
FIG. 19C is a cross-sectional view taken along line y-y' in FIG. 19A.

As illustrated in FIGS. 19A to 19C, a second metal such as nickel or cobalt is deposited, and a metal-semiconductor compound, that is, a silicide 118 is formed in an upper portion of the diffusion layer 112 formed in the upper portion of the fin-shaped silicon layer 103. In this case, the polysilicon gate electrode 114a and the polysilicon gate line 114b are covered with the second nitride film 117 and the first nitride film 115, and an upper portion of the pillar-shaped silicon layer 106 is covered with the second insulating film 113, the polysilicon gate electrode 114a, and the polysilicon gate line 114b. Accordingly, a silicide is not formed in these areas.

The description has been made of the fourth step of depositing a second nitride film, etching the second nitride film to be left as a sidewall, depositing a second metal, and forming a metal-semiconductor compound in an upper portion of the diffusion layer formed in the upper portion of the fin-shaped semiconductor layer.

Next, a fifth step will be described. The fifth step includes depositing a third nitride film, depositing an interlayer insulating film and planarizing the interlayer insulating film, exposing the second nitride film and the third nitride film, removing the exposed second nitride film and the third nitride film to expose the polysilicon gate electrode and the polysilicon gate line, removing the polysilicon gate electrode, the polysilicon gate line, and the second insulating film, depositing a gate insulating film, embedding a first metal in a portion from which the polysilicon gate electrode and the polysilicon gate line have been removed, and forming a metal gate electrode and a metal gate line by etching the first metal to expose the gate insulating film on an upper portion of the pillar-shaped semiconductor layer.

As illustrated in FIGS. 20A to 20C, a third nitride film 119 is deposited in order to protect the silicide 118.

As illustrated in FIGS. 21A to 21C, an interlayer insulating film 120 is deposited and planarized by chemical-mechanical polishing.

Figure 22A:
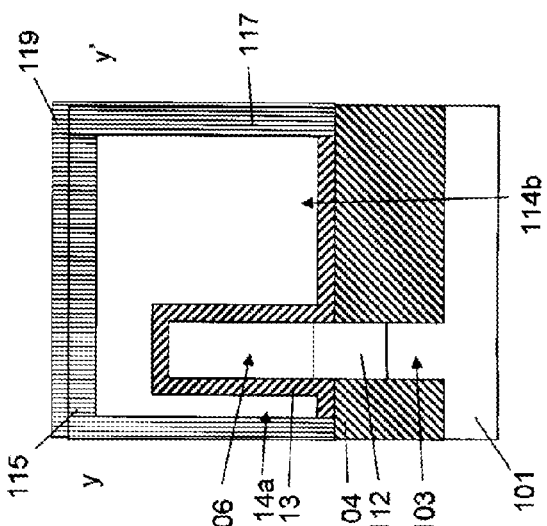
FIG. 22A is a plan view illustrating the method for producing a semiconductor device according to the present invention.
Figure 22B:
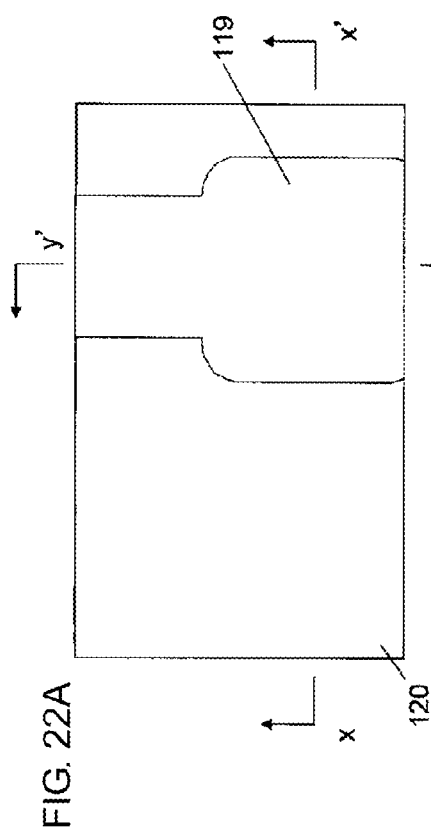
FIG. 22B is a cross-sectional view taken along line x-x' in FIG. 22A.
Figure 22C:
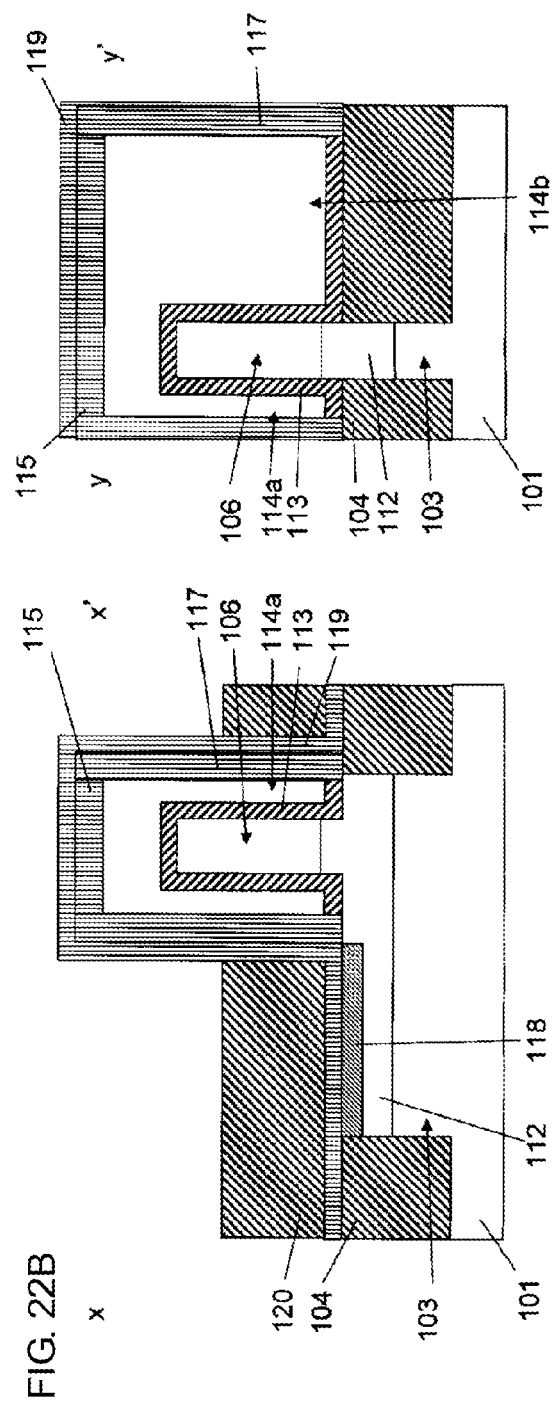
FIG. 22C is a cross-sectional view taken along line y-y' in FIG. 22A.

As illustrated in FIGS. 22A to 22C, the interlayer insulating film 120 is etched back to expose the second nitride film 117 and the third nitride film 119 that cover the polysilicon gate electrode 114a and the polysilicon gate line 114b.

As illustrated in FIGS. 23A to 23C, the exposed second nitride film 117 and the third nitride film 119 are removed to expose the polysilicon gate electrode 114a and the polysilicon gate line 114b. The etching used for removing the second nitride film 117 and the third nitride film 119 is preferably isotropic etching or wet etching.

As illustrated in FIGS. 24A to 24C, the exposed polysilicon gate electrode 114a and the polysilicon gate line 114b are removed. The etching used in this step is also preferably isotropic etching or wet etching.

As illustrated in FIGS. 25A to 25C, the second insulating film 113 is removed.

As illustrated in FIGS. 26A to 26C, a gate insulating film 121 and a first metal 122 are deposited. The first metal 122 is embedded in a portion from which the polysilicon gate electrode 114a and the polysilicon gate line 114b have been removed. Atomic layer deposition is preferably used for this embedding. The gate insulating film 121 may be a film that is commonly used in a semiconductor process, such as an oxide film, an oxynitride film, or a high-K dielectric film. The first metal 122 is a metal that is used in a semiconductor process and that determines the threshold voltage of a transistor. In this case, when the work function of the first metal 122 is in a range of 4.2 to 5.0 eV, the resulting transistor can operate as an enhancement-type transistor.

As illustrated in FIGS. 27A to 27C, the first metal 122 is etched to expose the gate insulating film 121 on an upper portion of the pillar-shaped silicon layer 106. As a result, a metal gate electrode 122a and a metal gate line 122b are formed.

The description has been made of the fifth step of depositing a third nitride film, depositing an interlayer insulating film and planarizing the interlayer insulating film, exposing the second nitride film and the third nitride film, removing the exposed second nitride film and the third nitride film to expose the polysilicon gate electrode and the polysilicon gate line, removing the polysilicon gate electrode, the polysilicon gate line, and the second insulating film, depositing a gate insulating film, embedding a first metal in a portion from which the polysilicon gate electrode and the polysilicon gate line have been removed, and forming a metal gate electrode and a metal gate line by etching the first metal to expose the gate insulating film on an upper portion of the pillar-shaped semiconductor layer.

Next, a sixth step will be described. The sixth step includes exposing an upper portion of the pillar-shaped semiconductor layer, depositing a third metal, and etching the third metal to form a sidewall composed of the third metal on an upper side wall of the pillar-shaped semiconductor layer.

Figure 28A:
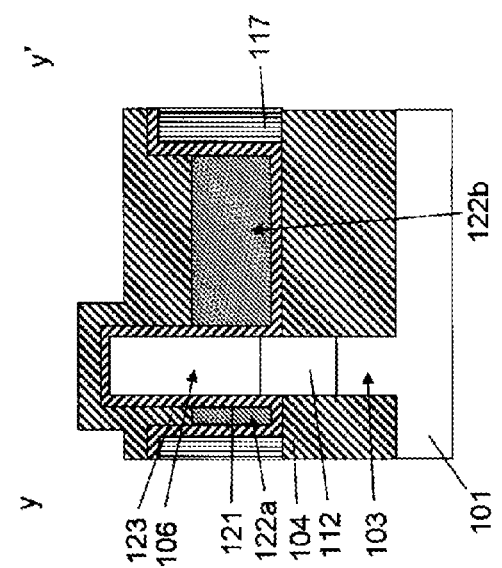
FIG. 28A is a plan view illustrating the method for producing a semiconductor device according to the present invention.
Figure 28B:
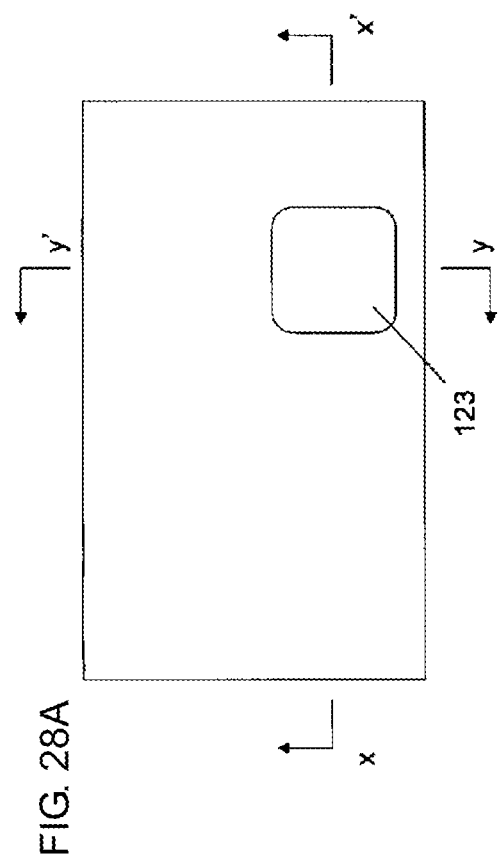
FIG. 28B is a cross-sectional view taken along line x-x' in FIG. 28A.
Figure 28C:
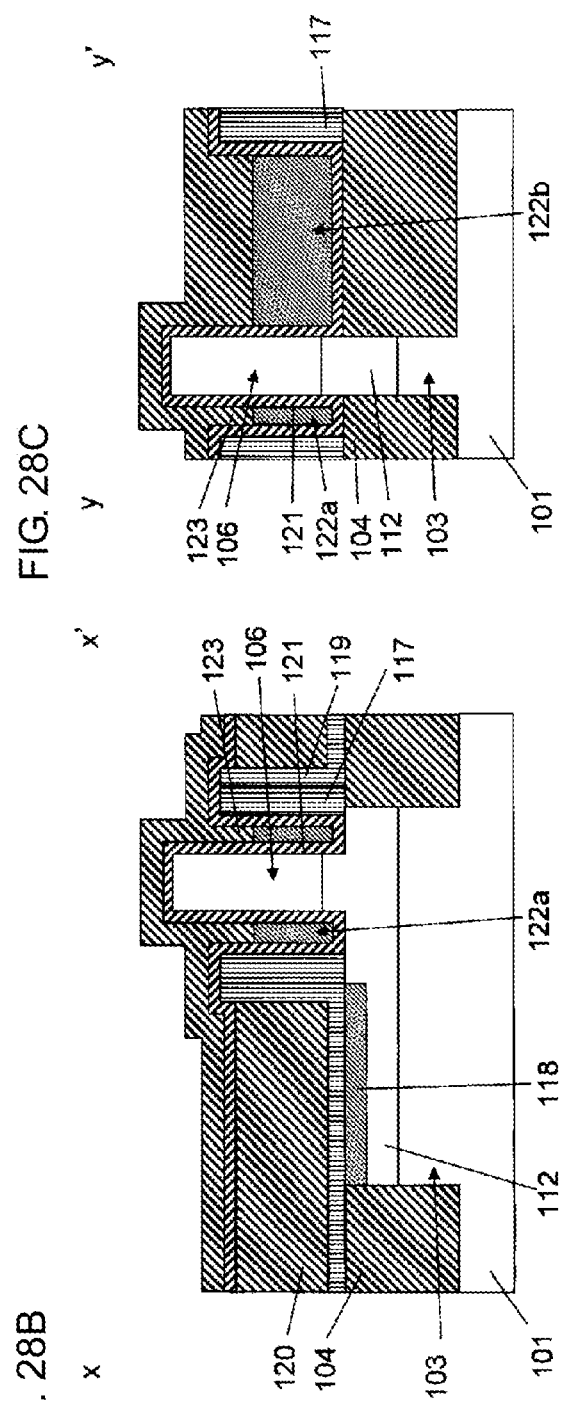
FIG. 28C is a cross-sectional view taken along line y-y' in FIG. 28A.

As illustrated in FIGS. 28A to 28C, an oxide film 123 is deposited.

As illustrated in FIGS. 29A to 29C, the oxide film 123 is etched back to be left on an upper surface of the metal gate electrode 122a. The etching in this step is preferably isotropic etching. In this case, an upper portion of the pillar-shaped silicon layer 106 is exposed.

As illustrated in FIGS. 30A to 30C, a third metal 124 is deposited.

When the third metal 124 has a work function in a range of 4.0 to 4.2 eV, this value is close to 4.05 eV, which is a work function of n-type silicon. Therefore, the upper portion of the pillar-shaped silicon layer 106 functions as n-type silicon. In this case, the third metal 124 is preferably, for example, a compound (TaTi) of tantalum and titanium or tantalum nitride (TaN).

When the third metal 124 has a work function in a range of 5.0 to 5.2 eV, this value is close to 5.15 eV, which is a work function of p-type silicon. Therefore, the upper portion of the pillar-shaped silicon layer 106 functions as p-type silicon. In this case, the third metal 124 is preferably, for example, ruthenium (Ru) or titanium nitride (TiN).

As illustrated in FIGS. 31A to 31C, the third metal 124 is etched to form a sidewall composed of the third metal 124 on an upper side wall of the pillar-shaped silicon layer 106. In the case where the gate insulating film 121 is left on the side wall of the pillar-shaped silicon layer 106, the sidewall composed of the third metal 124 is formed on the upper side wall of the pillar-shaped silicon layer 106 with the gate insulating film 121 therebetween.

The description has been made of the sixth step of exposing an upper portion of the pillar-shaped semiconductor layer, depositing a third metal, and etching the third metal to form a sidewall composed of the third metal on an upper side wall of the pillar-shaped semiconductor layer.

Next, a step of forming a contact and a metal wiring will be described.

As illustrated in FIGS. 32A to 32C, an interlayer insulating film 125 is deposited, planarized, and etched back to expose an upper surface of the pillar-shaped silicon layer 106 and an upper surface of the sidewall composed of the third metal 124.

Figure 33A:
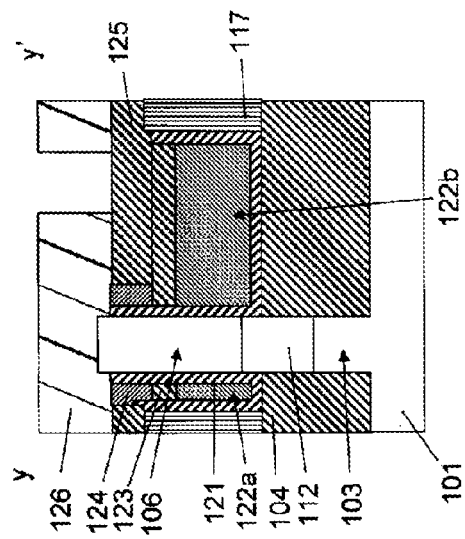
FIG. 33A is a plan view illustrating the method for producing a semiconductor device according to the present invention.
Figure 33B:
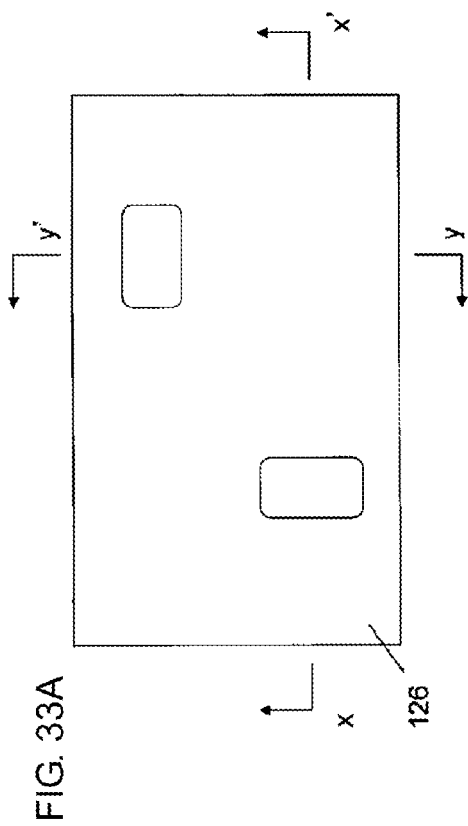
FIG. 33B is a cross-sectional view taken along line x-x' in FIG. 33A.
Figure 33C:
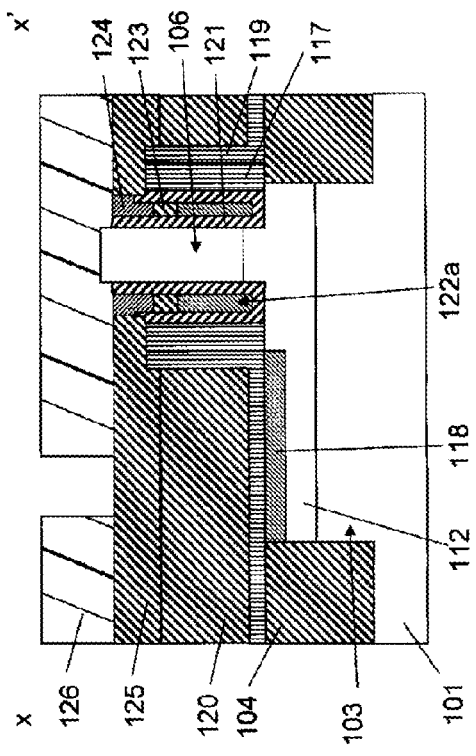
FIG. 33C is a cross-sectional view taken along line y-y' in FIG. 33A.

As illustrated in FIGS. 33A to 33C, a fourth resist 126 used for forming contact holes on the metal gate line 122b and the fin-shaped silicon layer 103 is formed.

Figure 34A:
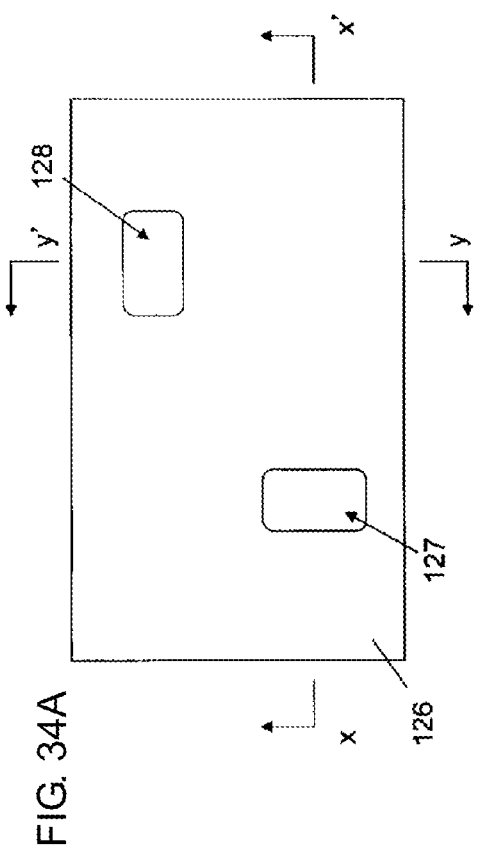
FIG. 34A is a plan view illustrating the method for producing a semiconductor device according to the present invention.
Figure 34C:
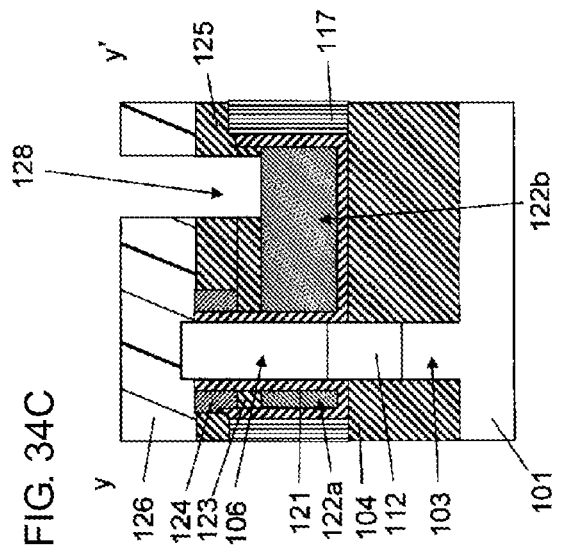
FIG. 34C is a cross-sectional view taken along line y-y' in FIG. 34A.
Figure 34B:
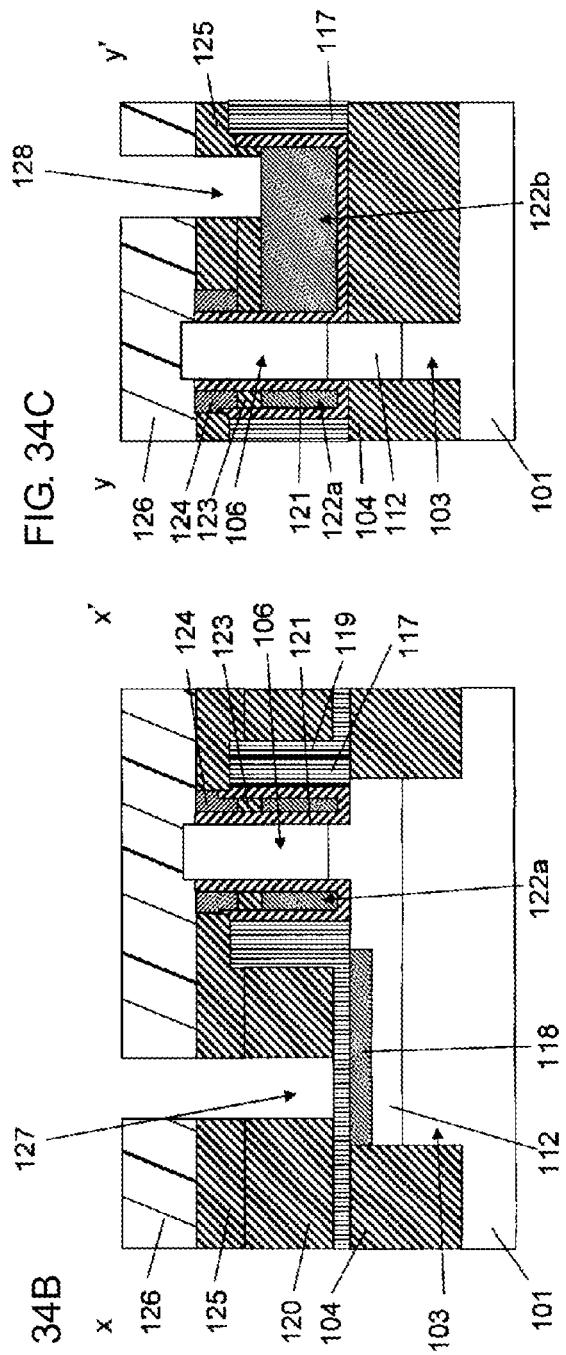
FIG. 34B is a cross-sectional view taken along line x-x' in FIG. 34A.

As illustrated in FIGS. 34A to 34C, the interlayer insulating films 120 and 125 and the oxide film 123 are etched to form contact holes 127 and 128.

As illustrated in FIGS. 35A to 35C, the fourth resist 126 is removed.

As illustrated in FIGS. 36A to 36C, the third nitride film 119 is etched to expose the silicide 118.

Figure 37C:
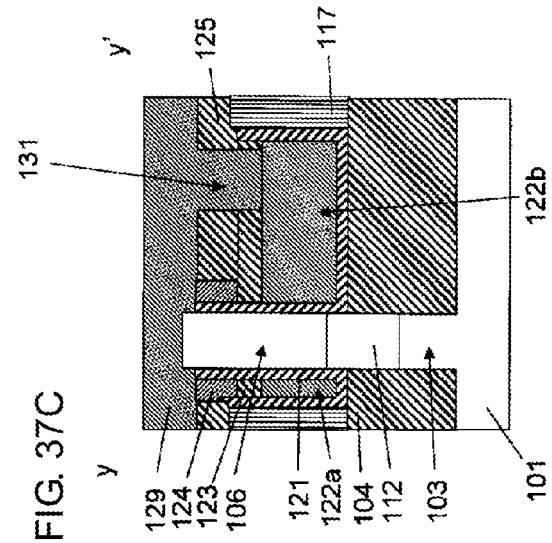
FIG. 37C is a cross-sectional view taken along line y-y' in FIG. 37A.
Figure 37A:
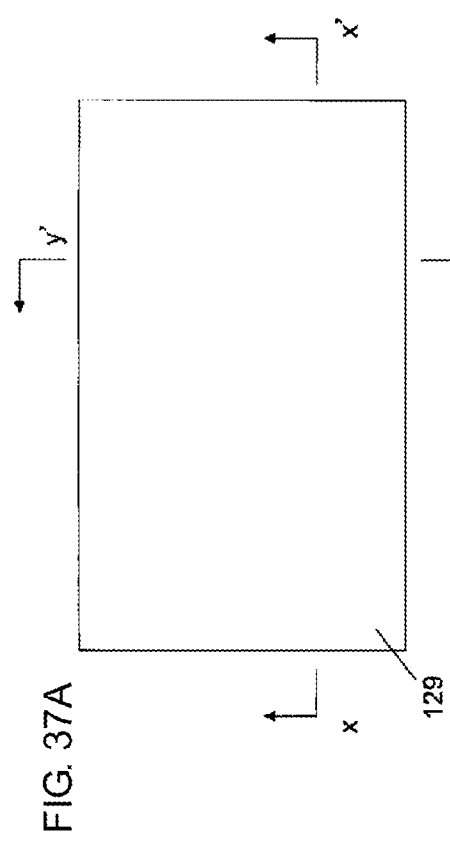
FIG. 37A is a plan view illustrating the method for producing a semiconductor device according to the present invention.
Figure 37B:
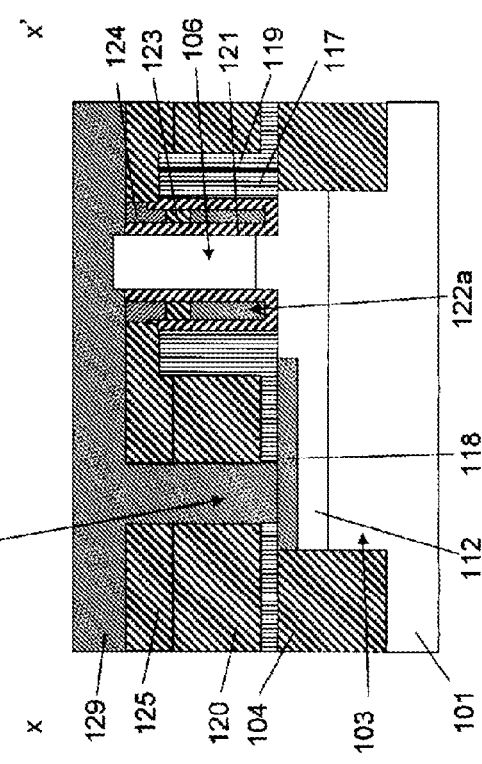
FIG. 37B is a cross-sectional view taken along line x-x' in FIG. 37A.

As illustrated in FIGS. 37A to 37C, a metal 129 is deposited. As a result, contacts 130 and 131 are formed. With this structure, the sidewall composed of the third metal 124 is connected to the upper surface of the pillar-shaped silicon layer 106. Accordingly, the same electric potential is applied to the upper portion of the pillar-shaped silicon layer 106 and the sidewall composed of the third metal 124. In the upper portion of the pillar-shaped silicon layer 106, a carrier is induced due to the difference in work function between the third metal 124 and silicon.

As illustrated in FIGS. 38A to 38C, fifth resists 132, 133, and 134 for forming metal wirings are formed.

As illustrated in FIGS. 39A to 39C, the metal 129 is etched to form metal wirings 135, 136, and 137.

As illustrated in FIGS. 40A to 40C, the fifth resists 132, 133, and 134 are removed.

The step of forming a contact and a metal wiring has been described.

FIGS. 1A to 1C show the resulting SGT produced by the method described above.

The SGT includes a fin-shaped silicon layer 103 formed on a silicon substrate 101, a first insulating film 104 formed around the fin-shaped silicon layer 103, a pillar-shaped silicon layer 106 formed on the fin-shaped silicon layer 103, a diffusion layer 112 formed in an upper portion of the fin-shaped silicon layer 103 and a lower portion of the pillar-shaped silicon layer 106, a metal-semiconductor compound 118 formed in an upper portion of the diffusion layer 112 that is formed in the upper portion of the fin-shaped silicon layer 103, a gate insulating film 121 formed around the pillar-shaped silicon layer 106, a metal gate electrode 122a formed around the gate insulating film 121, a metal gate line 122b connected to the metal gate electrode 122a, and a sidewall composed of a third metal 124 and formed on an upper side wall of the pillar-shaped silicon layer 106, in which the sidewall composed of the third metal 124 is connected to an upper surface of the pillar-shaped silicon layer 106.

An upper portion of the pillar-shaped silicon layer 106 can be made to function as an n-type semiconductor layer or a p-type semiconductor layer due to the difference in work function between a metal and a semiconductor without forming a diffusion layer in the upper portion of the pillar-shaped silicon layer 106. Therefore, a step of forming a diffusion layer in an upper portion of the pillar-shaped silicon layer 106 can be omitted.

When a silicon pillar becomes thin, it becomes difficult for impurities to exist in the silicon pillar because the density of silicon is $5 \times 10^{22}$ atoms/cm$^3$. However, with the structure described above, this problem can be prevented because a diffusion layer is not formed in an upper portion of the pillar-shaped silicon layer.

The description has been made of a production process for forming a structure of an SGT according to an embodiment of the present invention, and the structure of the SGT.

It is to be understood that various embodiments and modifications of the present invention can be made without departing from the broad spirit and the scope of the present invention. The embodiments described above are illustrative examples of the present invention and do not limit the scope of the present invention.

The invention claimed is:

1. A method for producing a semiconductor device, comprising:
   a first step of forming a fin-shaped semiconductor layer on a semiconductor substrate, forming a first insulating film around the fin-shaped semiconductor layer, and forming a pillar-shaped semiconductor layer in an upper portion of the fin-shaped semiconductor layer;

a second step of, after the first step, forming a second insulating film, a polysilicon gate electrode, and a polysilicon gate line, the second insulating film covering a periphery and an upper portion of the pillar-shaped semiconductor layer, the polysilicon gate electrode covering the second insulating film;

a third step of, after the second step, forming a diffusion layer in an upper portion of the fin-shaped semiconductor layer and a lower portion of the pillar-shaped semiconductor layer;

a fourth step of, after the third step, forming a metal-semiconductor compound in an upper portion of the diffusion layer formed in the upper portion of the fin-shaped semiconductor layer;

a fifth step of, after the fourth step, depositing an interlayer insulating film, exposing the polysilicon gate electrode and the polysilicon gate line, etching the polysilicon gate electrode and the polysilicon gate line, subsequently depositing a first metal, and forming a metal gate electrode and a metal gate line; and a sixth step of, after the fifth step, forming a sidewall composed of a third metal on an upper side wall of the pillar-shaped semiconductor layer, wherein the sidewall composed of the third metal is connected to an upper surface of the pillar-shaped semiconductor layer.

2. The method for producing a semiconductor device according to claim 1, wherein the diffusion layer is an n-type diffusion layer, and the third metal has a work function in a range of 4.0 to 4.2 eV.

3. The method for producing a semiconductor device according to claim 1, wherein the diffusion layer is a p-type diffusion layer, and the third metal has a work function in a range of 5.0 to 5.2 eV.

4. The method for producing a semiconductor device according to claim 1,
wherein the first step includes
forming, on a semiconductor substrate, a first resist for forming a fin-shaped semiconductor layer, etching the semiconductor substrate to form the fin-shaped semiconductor layer, removing the first resist,
depositing a first insulating film around the fin-shaped semiconductor layer, etching back the first insulating film to expose an upper portion of the fin-shaped semiconductor layer, forming a second resist so as to be perpendicular to the fin-shaped semiconductor layer, etching the fin-shaped semiconductor layer, and removing the second resist to form a pillar-shaped semiconductor layer such that a portion where the fin-shaped semiconductor layer and the second resist intersect at right angles becomes the pillar-shaped semiconductor layer.

5. The method for producing a semiconductor device according to claim 1,
wherein the second step includes,
for a structure including the fin-shaped semiconductor layer formed on the semiconductor substrate, the first insulating film formed around the fin-shaped semiconductor layer, and the pillar-shaped semiconductor layer formed on the fin-shaped semiconductor layer,
forming a second insulating film, depositing a polysilicon, planarizing the polysilicon such that an upper surface of the polysilicon after planarization is located at a position higher than the second insulating film located on the top of the pillar-shaped semiconductor layer, depositing a first nitride film, forming a third resist for forming a polysilicon gate electrode and a polysilicon gate line, etching the first nitride film, etching the polysilicon to form the polysilicon gate electrode and the polysilicon gate line, etching the second insulating film, and removing the third resist.

6. The method for producing a semiconductor device according to claim 1,
wherein the fourth step includes
depositing a second nitride film, etching the second nitride film to be left as a sidewall, depositing a second metal, and forming a metal-semiconductor compound in an upper portion of the diffusion layer formed in the upper portion of the fin-shaped semiconductor layer.

7. The method for producing a semiconductor device according to claim 6,
wherein the fifth step includes
depositing a third nitride film, depositing an interlayer insulating film and planarizing the interlayer insulating film, exposing the second nitride film and the third nitride film, removing the exposed second nitride film and the third nitride film to expose the polysilicon gate electrode and the polysilicon gate line, removing the polysilicon gate electrode, the polysilicon gate line, and the second insulating film, depositing a gate insulating film, embedding a first metal in a portion from which the polysilicon gate electrode and the polysilicon gate line have been removed, and forming a metal gate electrode and a metal gate line by etching the first metal to expose the gate insulating film on an upper portion of the pillar-shaped semiconductor layer.

8. The method for producing a semiconductor device according to claim 1,
wherein the sixth step includes
exposing an upper portion of the pillar-shaped semiconductor layer, depositing a third metal, and etching the third metal to form a sidewall composed of the third metal on an upper side wall of the pillar-shaped semiconductor layer.

* * * * *